(12) United States Patent
Kim et al.

(10) Patent No.: US 9,111,823 B2
(45) Date of Patent: Aug. 18, 2015

(54) IMAGE SENSOR

(71) Applicant: SAMSUNG ELECTRONICS CO., LTD., Suwon-Si, Gyeonggi-Do (KR)

(72) Inventors: Jin-Ho Kim, Seoul (KR); Duck-Hyung Lee, Seongnam-Si (KR); Young-Hoon Park, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 87 days.

(21) Appl. No.: 13/757,988

(22) Filed: Feb. 4, 2013

(65) Prior Publication Data

US 2013/0240960 A1    Sep. 19, 2013

(30) Foreign Application Priority Data

Mar. 16, 2012    (KR) .......................... 10-2012-0027330

(51) Int. Cl.
*H01L 27/146*    (2006.01)

(52) U.S. Cl.
CPC .......... *H01L 27/146* (2013.01); *H01L 27/1464* (2013.01); *H01L 27/14636* (2013.01); *H01L 27/14689* (2013.01)

(58) Field of Classification Search
CPC ....................... H01L 27/14636; H01L 27/1464
USPC ......................................................... 257/291
See application file for complete search history.

(56) References Cited

U.S. PATENT DOCUMENTS

| 6,323,534 | B1* | 11/2001 | Marr et al. ..................... 257/529 |
| 7,101,726 | B2 | 9/2006 | Yamamoto et al. |
| 7,749,796 | B2 | 7/2010 | Wakano et al. |
| 7,884,400 | B2 | 2/2011 | Shin |
| 8,017,982 | B2 | 9/2011 | Kirby et al. |
| 2009/0085143 | A1 | 4/2009 | Park |
| 2009/0140365 | A1 | 6/2009 | Lee et al. |
| 2010/0117180 | A1 | 5/2010 | Yun |
| 2010/0213560 | A1 | 8/2010 | Wang et al. |
| 2010/0244175 | A1* | 9/2010 | Park .............................. 257/459 |
| 2011/0115002 | A1 | 5/2011 | Tai et al. |
| 2011/0127629 | A1 | 6/2011 | Yorikado et al. |
| 2011/0186951 | A1 | 8/2011 | Pyo |
| 2012/0007198 | A1* | 1/2012 | Lin et al. ....................... 257/432 |

FOREIGN PATENT DOCUMENTS

| JP | 4525129 | 6/2010 |
| JP | 4534484 | 6/2010 |

* cited by examiner

*Primary Examiner* — Tucker Wright
(74) *Attorney, Agent, or Firm* — Volentine & Whitt, PLLC

(57) ABSTRACT

An image sensor having a sensor array area, a circuit area around the sensor array area, and a pad area adjacent to the circuit area includes a substrate, a multi-layer wiring structure including a plurality of wiring layers on a first surface of the substrate in the circuit area, at least one well in the substrate in the circuit area, and metal wiring that extends on a second surface of the substrate opposite to the first surface, from the pad area to the circuit area, and extends from the second surface into contacts with the at least one well.

20 Claims, 21 Drawing Sheets

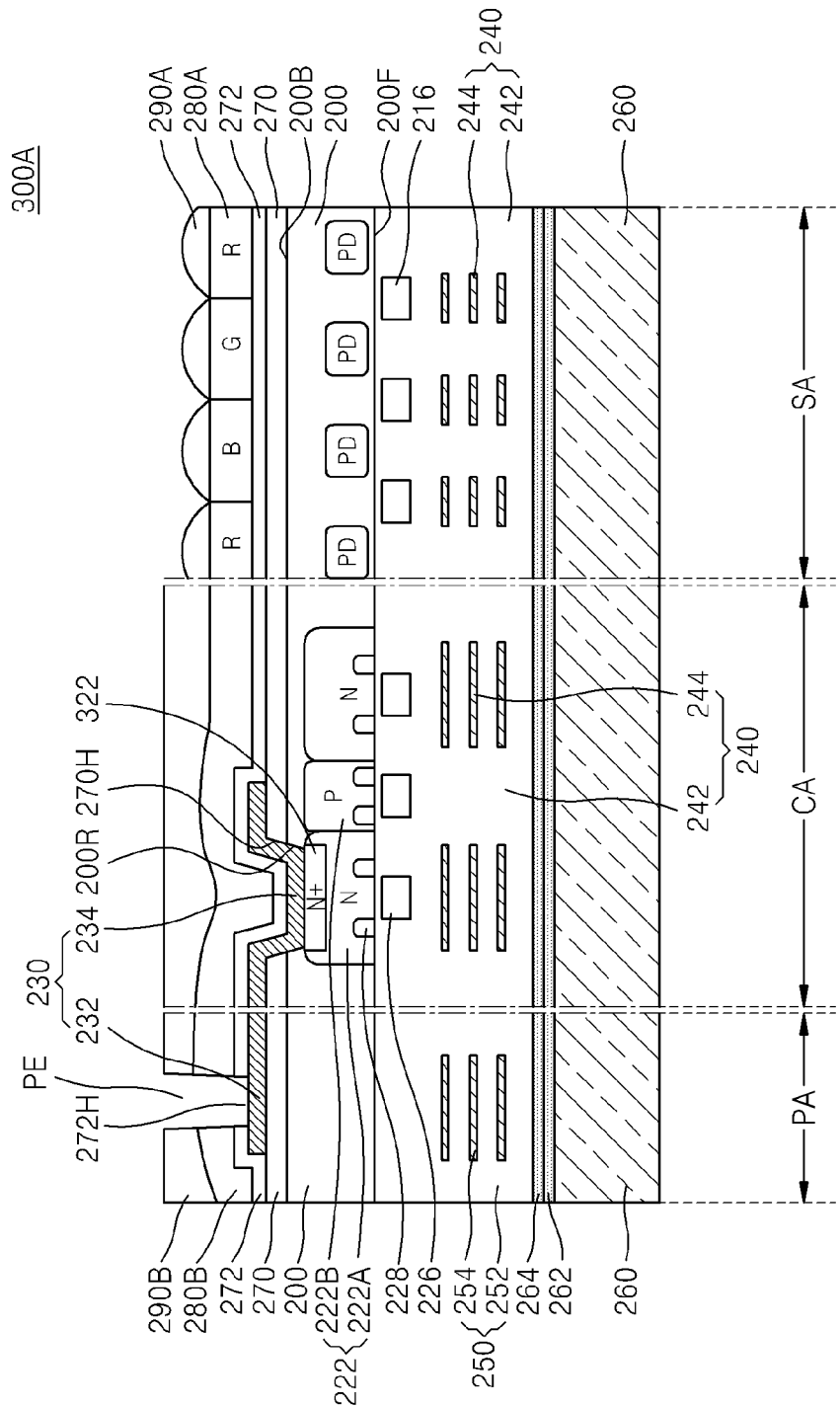

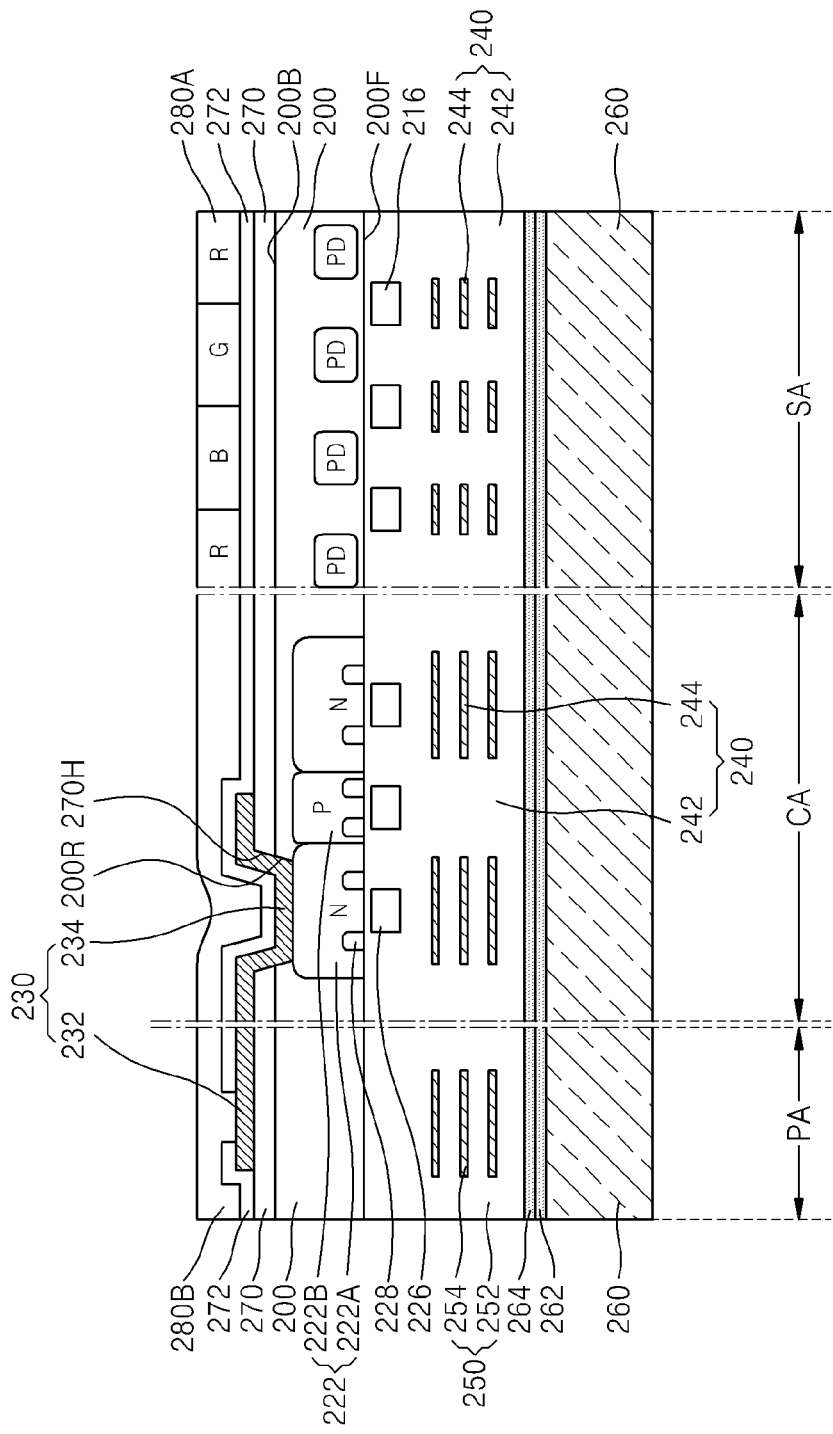

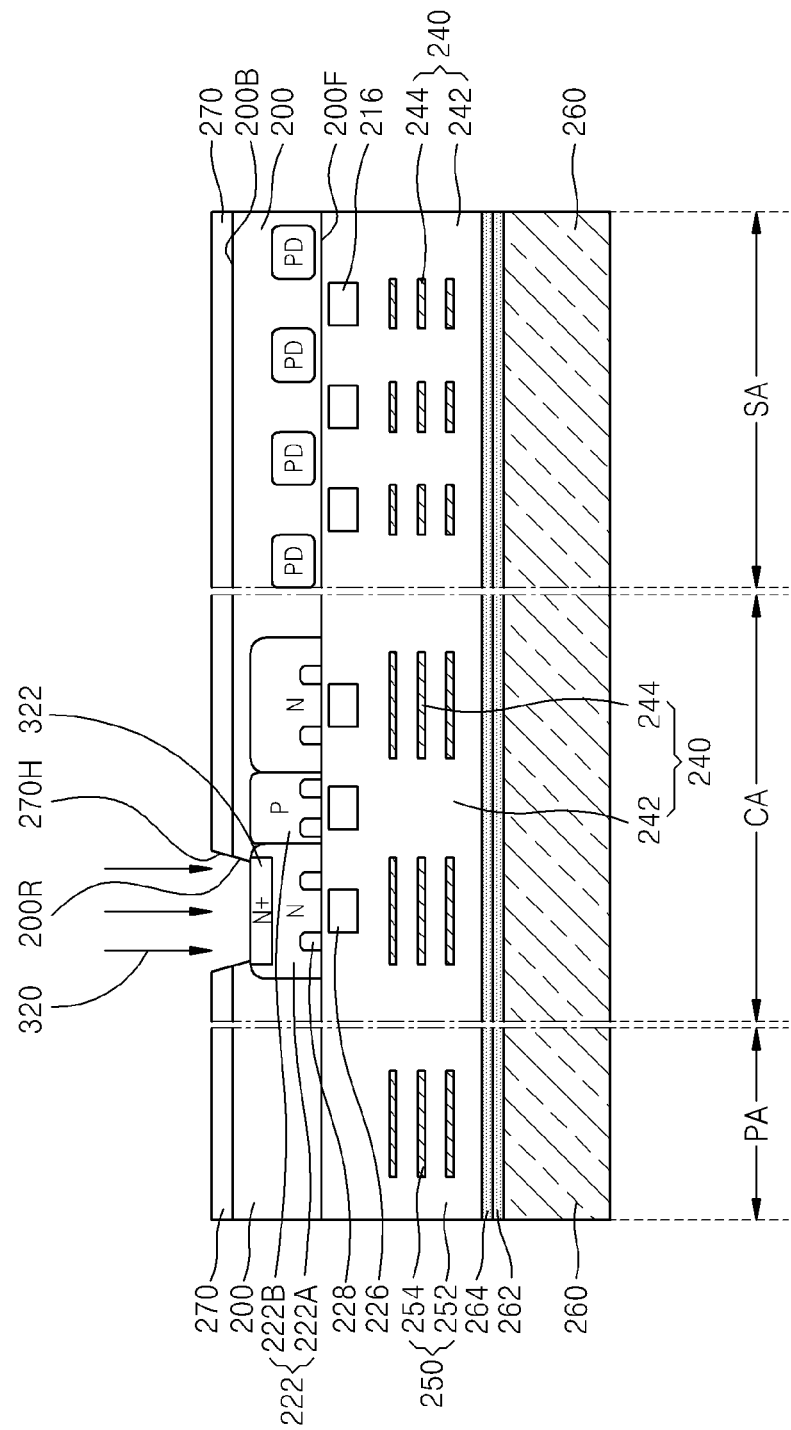

IMAGE SENSOR

PRIORITY STATEMENT

This application claims the benefit of Korean Patent Application No. 10-2012-0027330, filed on Mar. 16, 2012, in the Korean Intellectual Property Office, the disclosure of which is hereby incorporated by reference in its entirety.

BACKGROUND

The inventive concept relates to image sensors in general for converting an optical image into electrical signals. The inventive concept also relates to CMOS images sensors and to backside illuminated (BI) image sensors.

A complementary metal-oxide semiconductor (CMOS) image sensor has a pixel array area containing pixels, a circuit area containing circuits for driving and processing the output of the pixels, and a pad area containing wiring for transferring power from outside the sensor to the circuit area and for delivering the output of the sensor. As CMOS image sensors become more highly integrated, the density of the wiring of the CMOS image sensors, i.e., the amount of wiring per unit area, is being increased. As a result, the structure including the wiring for transferring power to the circuit area is becoming more complex, and the length of the wiring is increasing. Thus, it is difficult to provide a highly integrated CMOS image sensor having low resistance wiring.

Also, there is a type of CMOS image sensor known as a backside illuminated (BI) image sensor which includes a substrate having a back side on which light receiving elements are arranged, wiring structure attached to a front side of the substrate, and via contacts that pass through the substrate in the pad area for transferring the power supplied from outside the sensor to the wiring structure and hence, to the circuit area. However, the process of forming such via contacts is complicated and time consuming.

SUMMARY

According to one aspect of the inventive concept, there is provided an image sensor having a sensor array area containing an image sensor array, a circuit area extending around the sensor array area, and a pad area outside of the circuit area, and which comprises a substrate having in the circuit area an impurity region comprising at least one well, a multi-layer wiring structure disposed on a first surface of the substrate, and metal wiring extending from the pad area to the circuit area on a second surface of the substrate opposite to the first surface, and in which the multi-layer wiring structure includes a plurality of layers of wiring in the circuit area, and the metal wiring contacts the impurity region.

According to another aspect there is provided an image sensor having a sensor array area containing an image sensor array, a circuit area extending around the sensor array area, and a pad area outside the circuit area, and comprising a substrate having first and second opposite surfaces, a recess in the second surface, and an impurity region comprising at least one well in the circuit area, a plurality of gate electrodes on the first surface of the substrate in the circuit area, a multi-layer wiring structure including a plurality of layers of wiring on the plurality of gate electrodes in the circuit area, respective source/drain regions within each well in the circuit area, and metal wiring extending from the pad area to the circuit area on the second surface of the substrate, through the recess in the second surface of the substrate, and into contact with the impurity region.

According to still another aspect of the inventive concept, there is provided an image sensor having a sensor array area containing an image sensor array, a circuit area extending around the sensor array area, and a pad area outside of the circuit area, and which comprises a substrate having first and second opposite surfaces, and a well therein in the circuit area, a semiconductor device located at the first surface of the substrate and integrated with the well, a multi-layer wiring structure disposed on the first surface of the substrate and electrically connecting the semiconductor device to the sensor array, metal wiring extending from the pad area to the circuit area on the second surface of the substrate and electrically connected within the circuit area to the well at a location adjacent the second surface of the substrate, and a protective layer disposed on the second surface of the substrate over the metal wiring in the circuit area and the pad area and which exposes the metal wiring in the pad area.

BRIEF DESCRIPTION OF THE DRAWINGS

The inventive concept will be more clearly understood from the following detailed description of the preferred embodiments thereof made in conjunction with the accompanying drawings in which:

FIG. 5A is a cross-sectional view of another version of the first embodiment an image sensor according to the inventive concept, as also taken in a direction corresponding to that of line IV-IV' of FIG. 1;

FIGS. 8A through 8J are cross-sectional views illustrating a method of manufacturing an image sensor, according to the inventive concept;

FIGS. 9A and 9B are cross-sectional views illustrating a method of manufacturing another embodiment of an image sensor, according to the inventive concept.

DETAILED DESCRIPTION OF THE PREFERRED EMBODIMENTS

Figure 1:
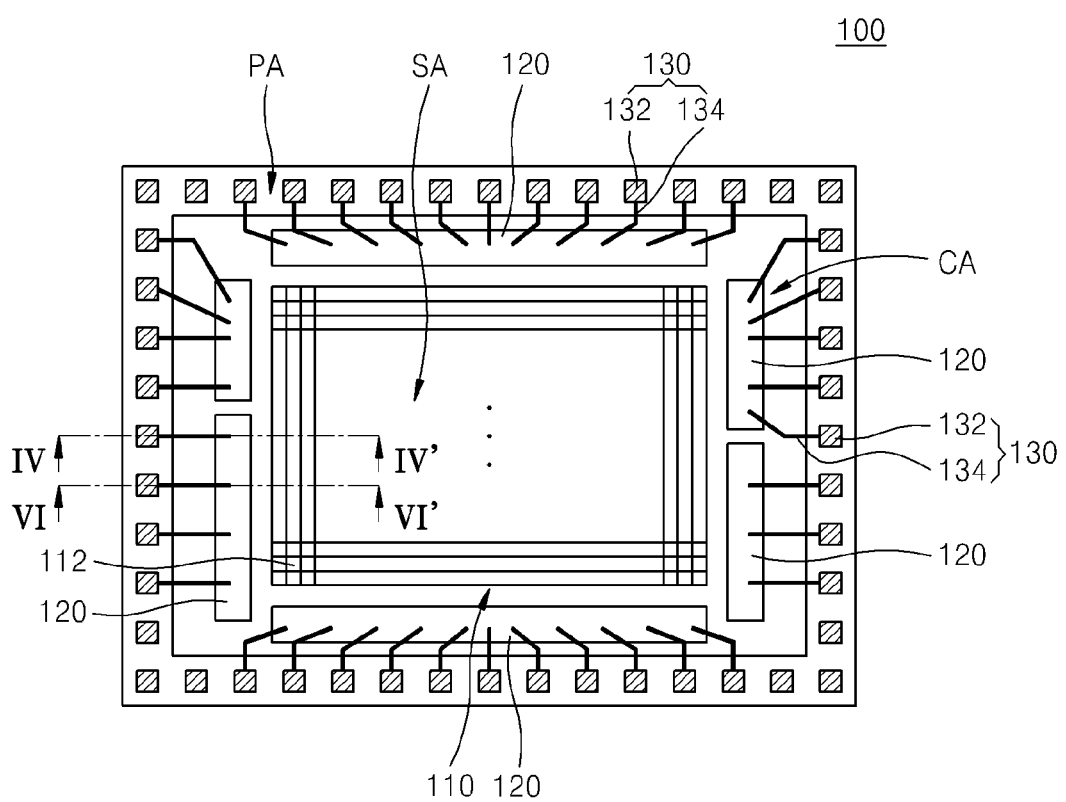
FIG. 1 is a schematic plan view of a basic layout of an image sensor according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer is referred to as being "on" or "connected to" another element or layer or surface, it can be directly on or directly connected to the other element or layer or surface or intervening elements or layers may be present. In contrast, when an element or layer is referred to as being "directly on" or "directly connected to" another element or layer or surface, there are no intervening elements or layers present.

Other terminology used herein for the purpose of describing particular examples or embodiments of the inventive concept is to be taken in context. For example, the term "impurity region" will refer in general to a region of a substrate containing impurities introduced into the body of the substrate by a known process such as implantation or diffusion, and the term "well" will be understood as an example of such an impurity region formed in the substrate so as to provide an active region in the substrate. The terms "comprises" or "comprising" when used in this specification specifies the presence of stated features or processes but does not preclude the presence or additional features or processes.

A general layout and set of electronic components of an image sensor 100 according to the inventive concept will now be described in detail with reference to FIGS. 1 and 2.

The image sensor 100 has a sensor array area SA, a circuit area CA that extends around the sensor array area SA and includes a plurality of circuits 120, and a pad area PA including a plurality of pads 132 disposed adjacent to the circuit area CA.

The sensor array area SA contains a sensor array 110 including a plurality of pixels 112. The pixels 112 each include a photoelectric conversion device.

The circuit area CA contains circuits 120 that supply signals to the pixels 112 of the sensor array 110 and process the signals output by the pixels 112. To these ends, as illustrated in FIG. 2, the circuits 120 in the circuit area CA each include a timing generator 122, a row decoder 123, a row driver 124, a correlated double sampler (CDS) 125, an analog-to-digital converter (ADC) 126, a latch 127, and a column decoder 128.

The pixels 112 of the sensor array 110 are driven by signals such as a row selection signal, a reset signal, or a charge transmission signal from the row driver 124. In addition, an electrical output signal that is produced photoelectrically in the sensor array 110 is supplied to the CDS 125.

The timing generator 122 supplies a timing signal and a control signal to the row decoder 123 and the column decoder 128.

The row driver 124 supplies the driving signals for driving the pixels 112 according to the decoding of input signals by the row decoder 123. When the pixels 112 are arranged in a matrix (rows and columns), the row driver 124 provides a driving signal to rows of pixels of the matrix.

The CDS 125 receives an output signal from the sensor array 110 and maintains and samples the received output signal in a dual manner. More specifically, the CDS 125 measures the voltages of a predetermined reference (noise level) signal and the voltages of signal output by the pixels, and outputs analog signals whose voltages are the differences between the reference and output signals to in filter out the noise.

The ADC 126 converts the analog signals to digital signals.

The latch unit 127 stores a state of (latches) the digital signals, and outputs the latched digital signals sequentially to an image signal output unit (not shown) according to decoding information produced by the column decoder 128.

In the illustrated example, the image sensor 100 is a backside illumination image sensor. Thus, light is incident on the sensor array area SA via a back side of the image sensor 100.

The image sensor 100 also includes metal wiring 130 extending from the pad area PA to the circuit area CA. The metal wiring 130 contacts wells 222 (see FIGS. 4 through 7) in the circuit area CA. More specifically, the metal wiring 130 includes pads 132 exposed at the back side of the image sensor 100 in the pad area PA and connection lines (wires) 134 extending from the pads 132, respectively, to the circuit area CA. The pads 132 are connected to the wells 222 in the circuit area CA via the connection lines 134.

In this embodiment, the metal wiring 130 may be formed of a metal, a metal nitride, or a combination thereof. Also, the pads 132 and each connection line 134 extending therefrom are unitary. Thus, the pads 132 and connection lines 134 are of the same material in this embodiment, i.e., may also be of a metal, a metal nitride, or a combination thereof.

The pads 132 exposed in the pad area PA transmit or receive electrical signals to or from an external device (not shown). For example, the plurality of pads 132 transfer a driving power signal such as a power voltage or a ground voltage to circuits 120 of the circuit area CA via the connection lines 134.

An example of an equivalent circuit of a pixel 112 constituting the sensor array 110 of the image sensor 100 will now be described with reference to FIG. 3.

Each pixel 112 includes a photodiode PD and a plurality of MOS transistors. The photodiode PD generates charges by photoelectrically converting incident light and collects the generated charges. The MOS transistors in this example consist of a transfer transistor Tx that transports the charges accumulated in the photodiode PD to a floating diffusion region (FD), a reset transistor Rx that periodically resets the charges stored in the floating diffusion region FD, a drive transistor Dx functioning as a source follower buffer amplifier and buffering a signal according to the charges in the floating diffusion region FD, and a select transistor Sx performing switching or addressing for selecting the pixel 112. However, it should be noted that the inventive concept is not limited to pixels constituted by a photodiode as a photoelectric conversion device and/or by four MOS transistors.

Figure 3:
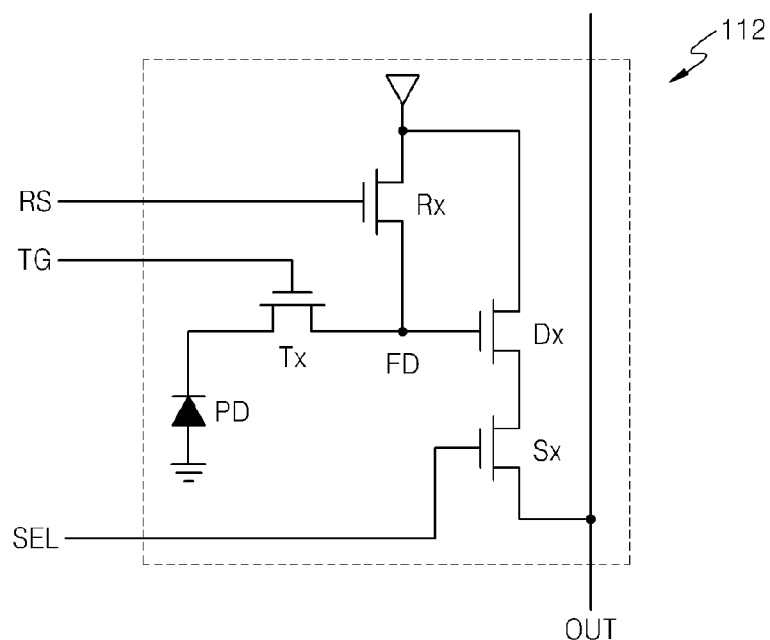
FIG. 3 is an equivalent circuit diagram of a pixel of an image sensor according to the inventive concept.

Also, in FIG. 3, RS denotes a signal applied to a gate of the reset transistor Rx, TG denotes a signal applied to a gate of the transfer transistor Tx, and SEL denotes a signal applied to a gate of the select transistor Sx.

One embodiment of an image sensor according to the inventive concept will now be described in more detail with reference to FIG. 4. The image sensor 300 of the embodiment of FIG. 4 may have a layout, components and equivalent circuitry similar to those described above with reference to FIGS. 1 through 3.

The image sensor 300 has a substrate 200. In the illustrated example of this embodiment, the substrate 200 is a semiconductor substrate. For example, the substrate 200 may consist of a bulk semiconductor substrate such as a P-type silicon substrate, may comprise a P-type bulk substrate and a P-type or N-type epi-layer extending (grown) on the P-type bulk substrate, or may comprise an N-type bulk substrate and a P-type or N-type epi-layer extending (grown) on the N-type bulk substrate. Alternatively, the substrate 200 may be an organic plastic substrate. In the illustrated example, the substrate 200 is a bulk P-type semiconductor substrate.

In the sensor array area SA, a plurality of photodiodes PD that constitute pixels 112 are disposed within the substrate 200, and a plurality of gate electrodes 216 are disposed on a front side (surface) 200F of the substrate 200. The gate electrodes 216 may be those of transfer, reset, drive, and select transistors Sx described above with reference to FIG. 3.

The circuit area CA contains the circuits 120 for controlling the pixels 112 (as was shown in and described with reference to FIGS. 1 and 3). The circuits 120 include a plurality of CMOS devices, a plurality of resistors, and a plurality of capacitors.

The circuit area CA also includes at least one impurity region in the form of a well 222 in the substrate 200 and in which components of the circuits 120 (see FIG. 1) are formed. In this example, the at least one well 222 includes a first conductivity type first well 222A (hereinafter referred to as the first well 222A) and a second conductivity type second well 222B (hereinafter referred to as the second well 222B). The second conductivity type is opposite to the first conductivity type. Also, the first well 222A is an N-type well, and the second well 222B is a P-type well in this example. Also, a second well 222B is interposed between two first wells 222A. However, the inventive concept is not limited to such an arrangement of first wells 222A and second wells 222B.

Also, in this embodiment, gate electrodes 226 of transistors of the circuits 120 (see FIG. 1) are disposed on the front side (surface) 200F of the substrate 200 in the circuit area CA, and source/drain regions 228 of the transistors are formed in each of a plurality of wells 222 at both sides of each gate electrode 226.

The image sensor 300 also has a multi-layer wiring structure 240 on the front side (surface) 200F of the substrate 200 in the sensor array area SA and the circuit area CA. The multi-layer wiring structure 240 includes an interlayer insulating layer 242 and a plurality of vertically spaced apart layers of wiring 244 (each of which layers will be referred to hereinafter as a "wiring layer"). The wiring layers 244 are insulated from one another via the interlayer insulating layer 242.

The image sensor 300 may also have a multi-layer wiring structure 250 disposed on the front side (surface) 200F of the substrate 200 in the pad area PA. In this case, the multi-layer wiring structure 250 includes an interlayer insulating layer 252 and a plurality of dummy layers of wiring 254 (referred to hereinafter as "dummy wiring layers", respectively) within the interlayer insulating layer 252. The dummy wiring layers 254 in the pad area PA are not electrically connected to any of the wiring layers 244 in the circuit area CA and have no electrical connection function in the pad area PA, i.e., they are electrically inactive in the image sensor 300. Rather, the dummy wiring layers 254 merely serve as a reinforcement to prevent the interlayer insulating layer 252 from being deformed due to an external physical impact.

In another example of this embodiment, the dummy wiring layers 254 are omitted, i.e., the interlayer insulating layer on the front side 200F of the substrate 200 is devoid of metal wiring in the pad area PA.

A support substrate 260 is adhered to an upper surface of the interlayer insulating layers 242 and 252. To this end, adhesive layers 262 and 264 are respectively interposed between the interlayer insulating layers 242 and 252 and the support substrate 260. In an example of this embodiment, the adhesive layers 262 and 264 are each a silicon oxide layer.

The support substrate 260 is, for example, a silicon substrate or a glass substrate. The support substrate 260 reinforces the substrate 200, especially in the case in which the substrate 200 has been thinned by a polishing operation or the like.

A back side (surface) 200B of the substrate 200 is covered by an insulating layer 270. The insulating layer 270 may be an oxide layer, a nitride layer, or a combination thereof. The insulating layer 270 functions as an anti-reflection layer and/or a buffer layer. A recess 200R extending in the substrate 200 from the back side 200B thereof, and a hole 270H aligned therewith in the insulating layer 270 expose at least one of the wells 222.

The at least one well 222 exposed by the hole 270H and the recess 200R contacts metal wiring 230 adjacent the back side 200B of the substrate. An ohmic contact is formed at the junction between the well 222 and the metal wiring 230. The metal wiring 230 includes a conductive pad 232 and a connection line 234. The pad 232 and the connection line 234 respectively correspond to the pad 132 and the connection line 134 shown in and described above with reference to FIG. 1. A portion of the metal wiring 230 extends on the insulating layer 270 parallel to the plane of the substrate 200. The insulating layer 270 functions to prevent a short circuit between the substrate 200 and the metal wiring 230.

The metal wiring 230 is not electrically connected to the dummy wiring layers 254 of the pad area PA. An electrical signal is supplied from the outside to the exposed pad 232 of the metal wiring 230, and the driving power supplied via the pad 232 passes through the connection line 234 outside the substrate 200 and to the well(s) 222. For example, a well bias may be applied to the well(s) 222 from the outside through the pad 232 and the connection line 234 of the metal wiring 230. The well bias may be a power voltage Vdd.

The metal wiring 230 may consist of at least one layer of metal selected from the group consisting of aluminum (Al), tungsten (W), and copper (Cu). Alternatively, the metal wiring 230 may be formed of a combination of a barrier layer and at least one metal layer. In this case, the barrier layer may be formed of Ti, TiN, Ta, TaN, or a combination thereof, and each at least one metal layer may be a layer of Al, W, or Cu.

The image sensor 300 also has a first protection layer 272 disposed on the back side (surface) 200B of the substrate 200 in the sensor array area SA, the circuit area CA, and the pad area PA. Portions of the metal wiring 230 are covered by the first protection layer 272. The first protection layer 272 serves as an anti-reflection layer. In an exposure region PE of the pad area PA, a hole 272H in the first protection layer 272 exposes the metal wiring 230 to the outside.

The first protection layer 272 may be an oxide layer, a nitride layer, or a combination thereof. In this respect, the first protection layer 272 may be of the same material as or of material different from that the insulating layer 270.

A plurality of color filters 280A are disposed on the first protection layer 272 in the sensor array area SA, and microlenses 290A are disposed on the color filters 280A. The color filters 280A include a plurality of red (R) regions, a plurality of blue (B) regions, and a plurality of green (G) regions. In this embodiment, each region of a color filter 280A and a respective microlens 290A are disposed at a location corresponding to (e.g., vertically aligned with) the location of a respective one of the photodiodes PD. Each microlens 290A focuses incident light onto a respective photodiode PD through a region of a color filter 280A. Also, a planarization layer (not shown) may be interposed between the color filters 280A and the microlenses 290A.

In the pad area PA, a second protection layer 280B and a third protection layer 290B are disposed in the foregoing sequence on the first protection layer 272. The second protection layer 280B extends over the substrate 200 at the same level as the color filters 280A. Furthermore, the second protection layer 280B is of the same material as one of the R, B regions, and G regions of the color filters 280A. The third protection layer 290B extends over the substrate 200 at the same level as the microlenses 290A. The third protection layer 290B is formed of the same material as the microlenses 290A in this embodiment.

Both the second protection layer 280B and the third protection layer 290B have (aligned) holes extending therethrough and which communicate with the hole 272H in the first protection layer 272. The vertically aligned holes in the protection layers 272, 280B and 290B define the exposure region PE at which the metal wiring 230 is exposed.

In another example of this embodiment, the third protection layer 290B is omitted.

Another version 300A of the first embodiment of an image sensor according to the inventive concept is shown in FIG. 5A. The image sensor 300A is substantially the same as the image sensor 300 of FIG. 4 except that a high-density impurity region 322 is formed in well 222 to form an ohmic contact at the junction between the connection line 234 of the metal wiring 230 and the high-density impurity region 322.

The high-density impurity region 322 has impurities of the same conductivity type as that of the well 222, but the density of the impurities is higher than that of the impurities in the well 222. In this example, the high-density impurity region 322 is thus an N+ type well. The connection line 234 of the metal line wiring 230 is in ohmic contact with the high-density impurity region 322.

Figure 4:
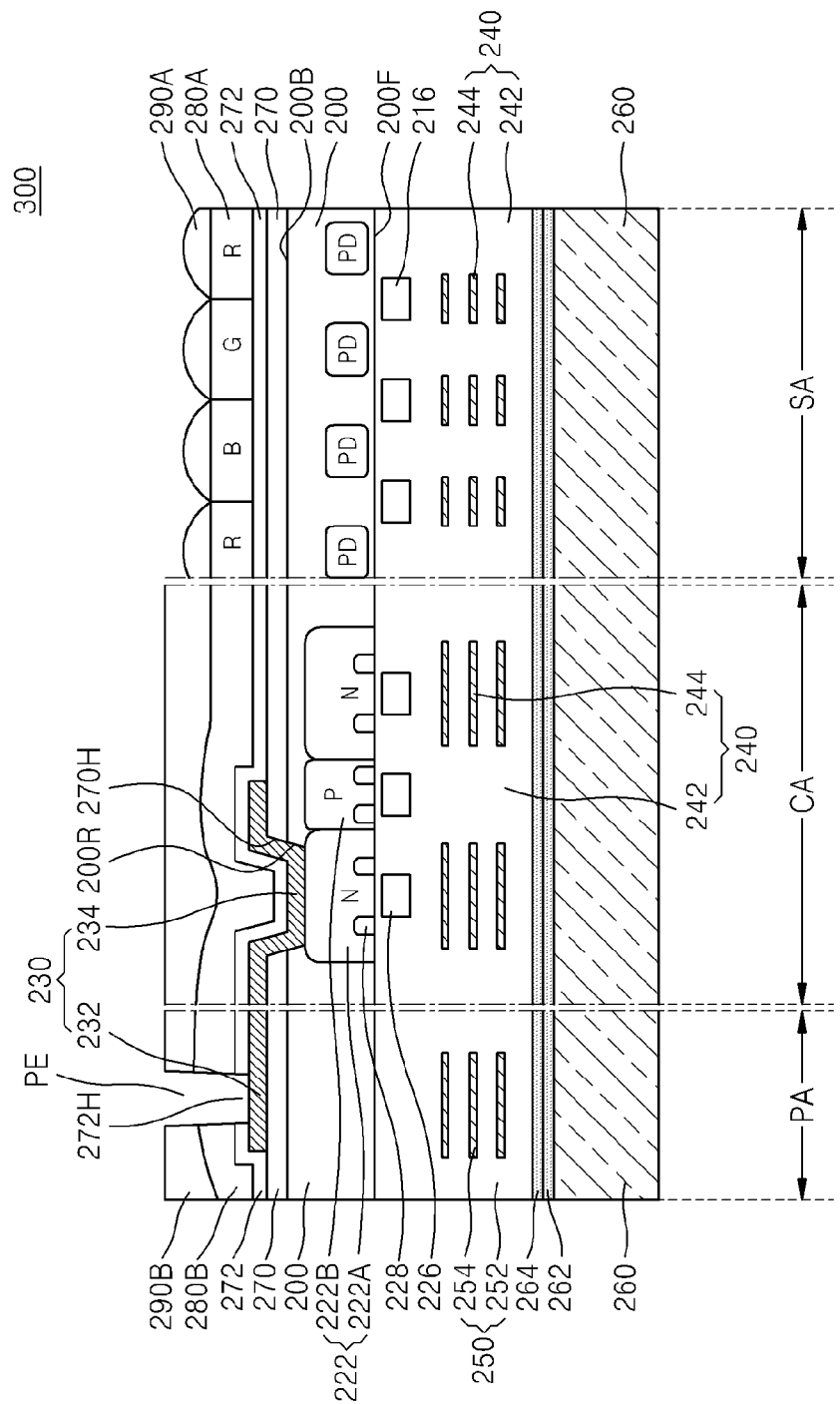
FIG. 4 is a cross-sectional view of a first embodiment of an image sensor taken in a direction corresponding to that of line IV-IV' of FIG. 1.
Figure 5B:
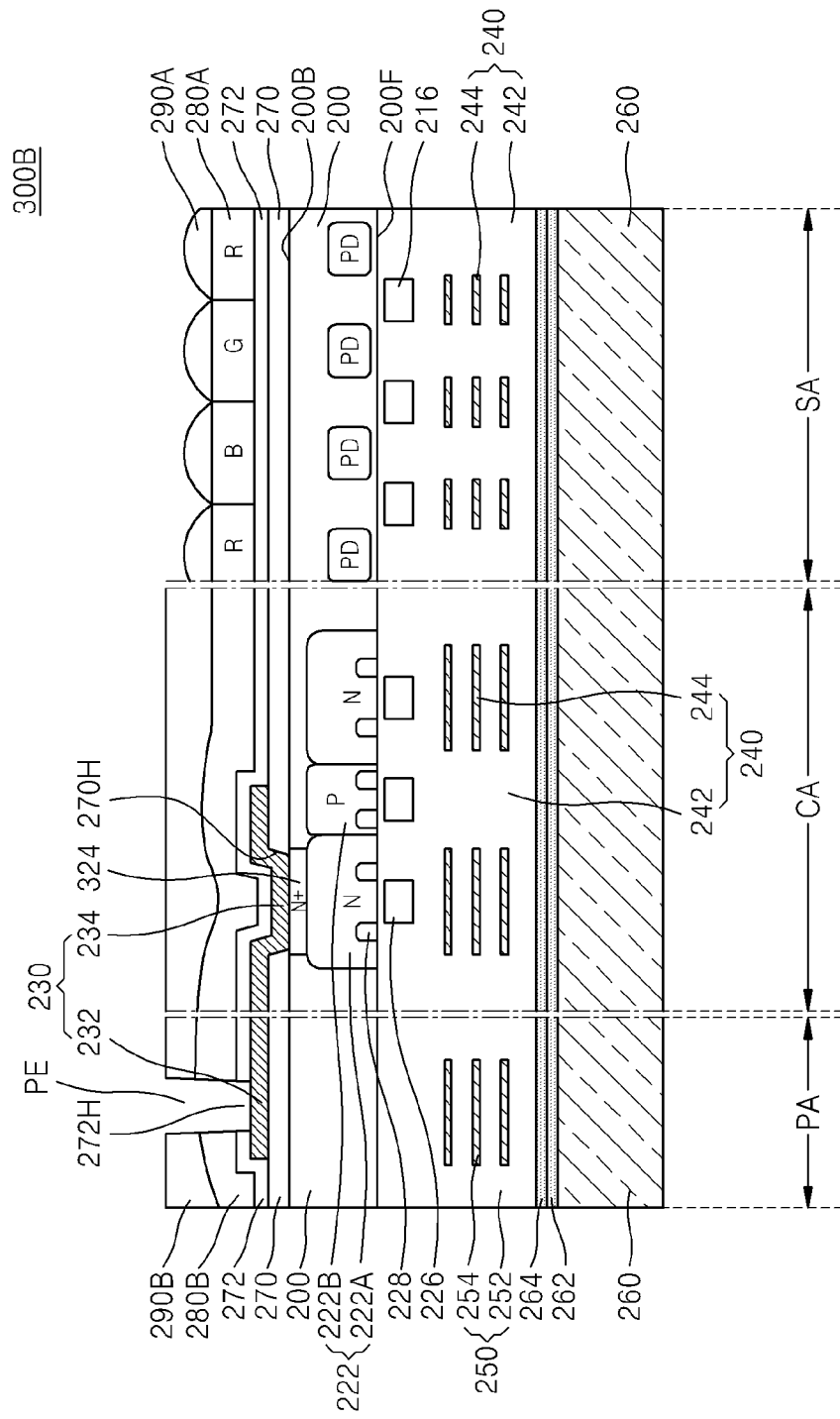
FIG. 5B is a cross-sectional view of still another version of the first embodiment of an image sensor according to the inventive concept, as also taken in a direction corresponding to that of line IV-IV' of FIG. 1.

Another version 300B of the first embodiment of an image sensor according to the inventive concept is shown in FIG. 5B. The image sensor 300B is substantially the same as the image sensor 300 of FIG. 4 except that there is no recess 200R in the back side (surface) 200B of the substrate 200 below the metal wiring 230.

Instead, in this embodiment, the back side (surface) 200B of the substrate 200 is planar throughout the sensor array area SA, the circuit area CA, and the pad area PA.

Also, a high-density impurity region 324 is formed between the at least one well 222 and the back side (surface) 200B of the substrate 200 such that an ohmic contact if formed at the junction between the high-density impurity region 324 and the connection line 234 of the metal wiring 230. In more detail, the high-density impurity region 324 extends from the back side (surface) 200B of the substrate 200 to the well 222, and is exposed through the hole 270H in the insulating layer 270. The high-density impurity region 324 is a region containing impurities of the same conductivity type as that of the well 222, but the impurity density thereof is higher than that of the well 222. Thus, in this example, the impurity region 324 is an N+ type well, and the connection line 234 of the metal wiring 230 is in ohmic contact with the N+ type well.

Figure 6:
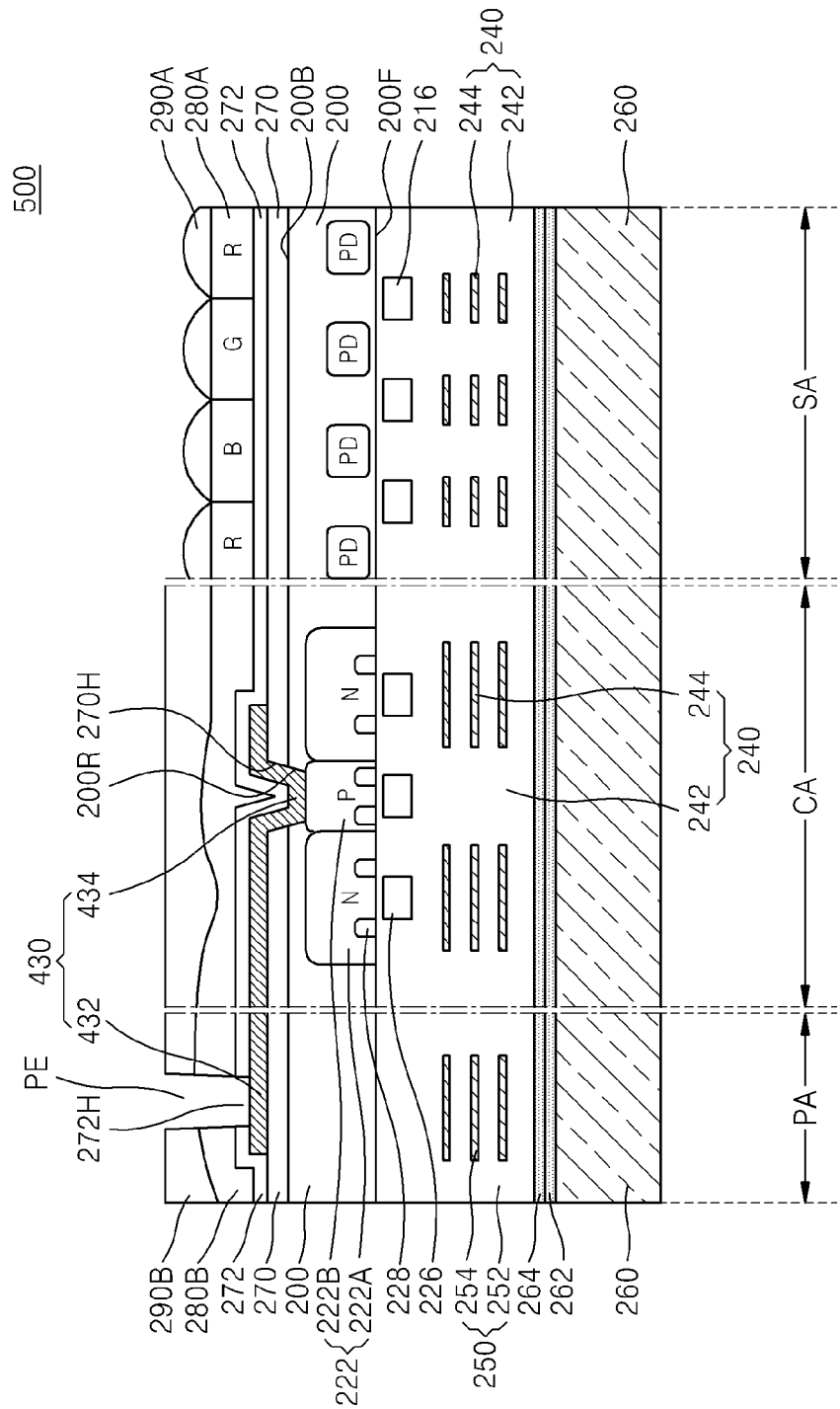
FIG. 6 is a cross-sectional view of a second embodiment of an image sensor according to the inventive concept taken in a direction corresponding to that of line VI-VI' of FIG. 1.

Another embodiment of an image sensor 500 according to the inventive concept is shown in FIG. 6. Note, that FIG. 6 is a sectional view taken along line VI-VI' in FIG. 1, instead of line IV-IV', merely as a way to indicate that FIG. 6 illustrates an embodiment different from that of FIG. 4. However, in each of the embodiments of FIGS. 4 and 6, the image sensor will have substantially the same configuration in the sections taken along lines IV-IV' and VI-VI'.

The image sensor 500 is substantially the same as the image sensor 300 of FIG. 4 except that metal wiring 430 contacts the second well 222B, e.g., a P-type well, interposed between first wells 222A adjacent to the back side (surface) 200B of the substrate 200.

More specifically, the metal wiring 430 includes a pad 432 and a connection line 434. The pad 432 and the connection line 434 correspond to the pad 132 and the connection line 134, respectively, shown in and described with reference to FIG. 1. The metal wiring 430 extends on the insulating layer 270 covering the back side (surface) 200B of the substrate 200. An electrical signal supplied from the outside to the circuit area CA via the pad 432 passes through the connection line 434 so that a well bias is applied to second well 222B of the well 222. The well bias may be a power voltage Vdd.

Otherwise, the metal wiring 430 is substantially the same as the metal wiring 230 of the embodiment of FIG. 4.

Figure 7A:
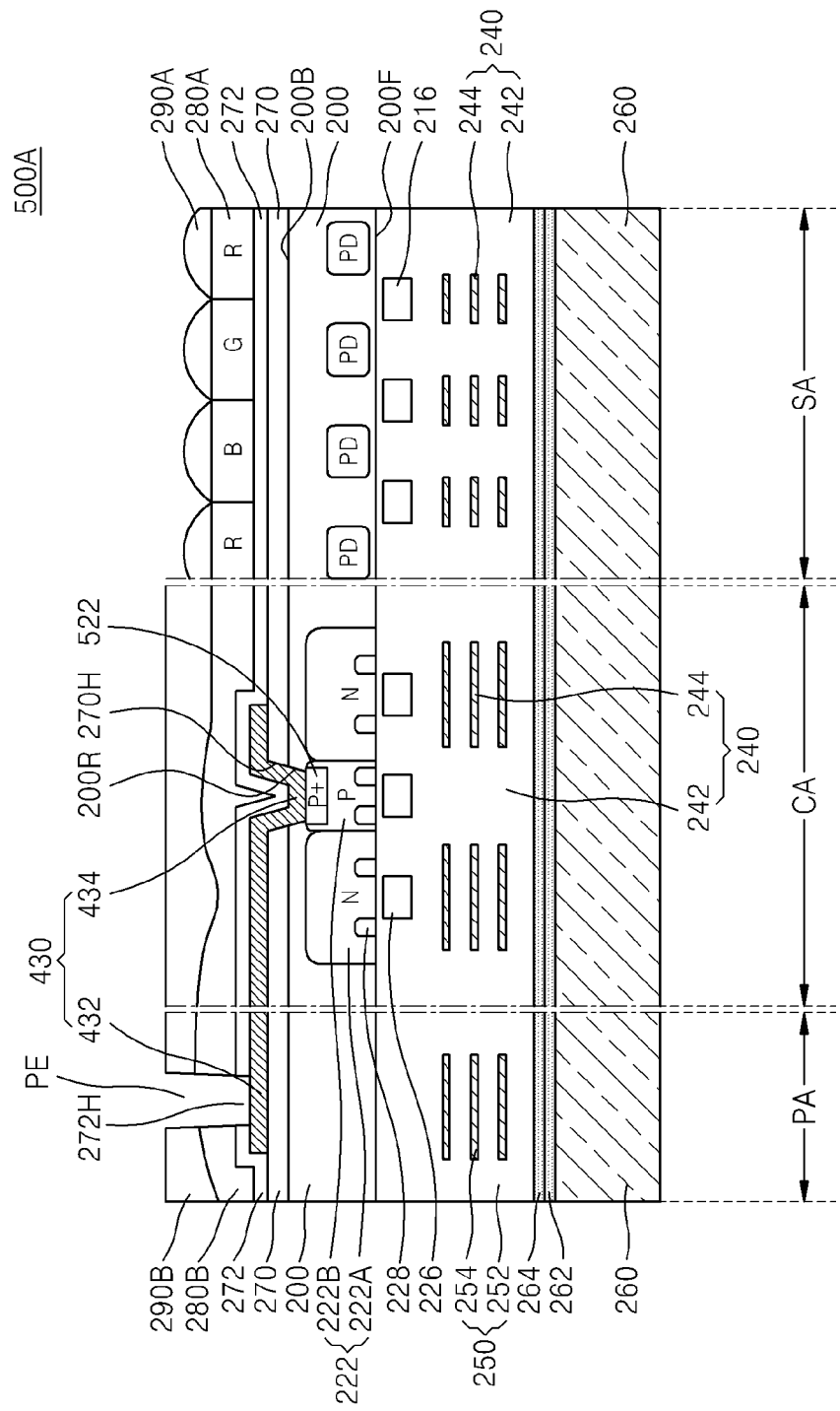
FIG. 7A is a cross-sectional view of another version of the second embodiment of an image sensor according to the inventive concept, as also taken in a direction corresponding to that of line VI-VI' of FIG. 1.

Another version 500A of the second embodiment of an image sensor according to the inventive concept is shown in FIG. 7A. The image sensor 500A is substantially the same as the image sensor 500 of FIG. 6 except that a high-density impurity region 522 is formed in second well 222B to form an ohmic contact with the metal wiring 430. The high-density impurity region 522 contains impurities of the same conductivity type as that of the second well 222B, but the impurity density thereof is higher than that of the second well 222B.

Figure 7B:
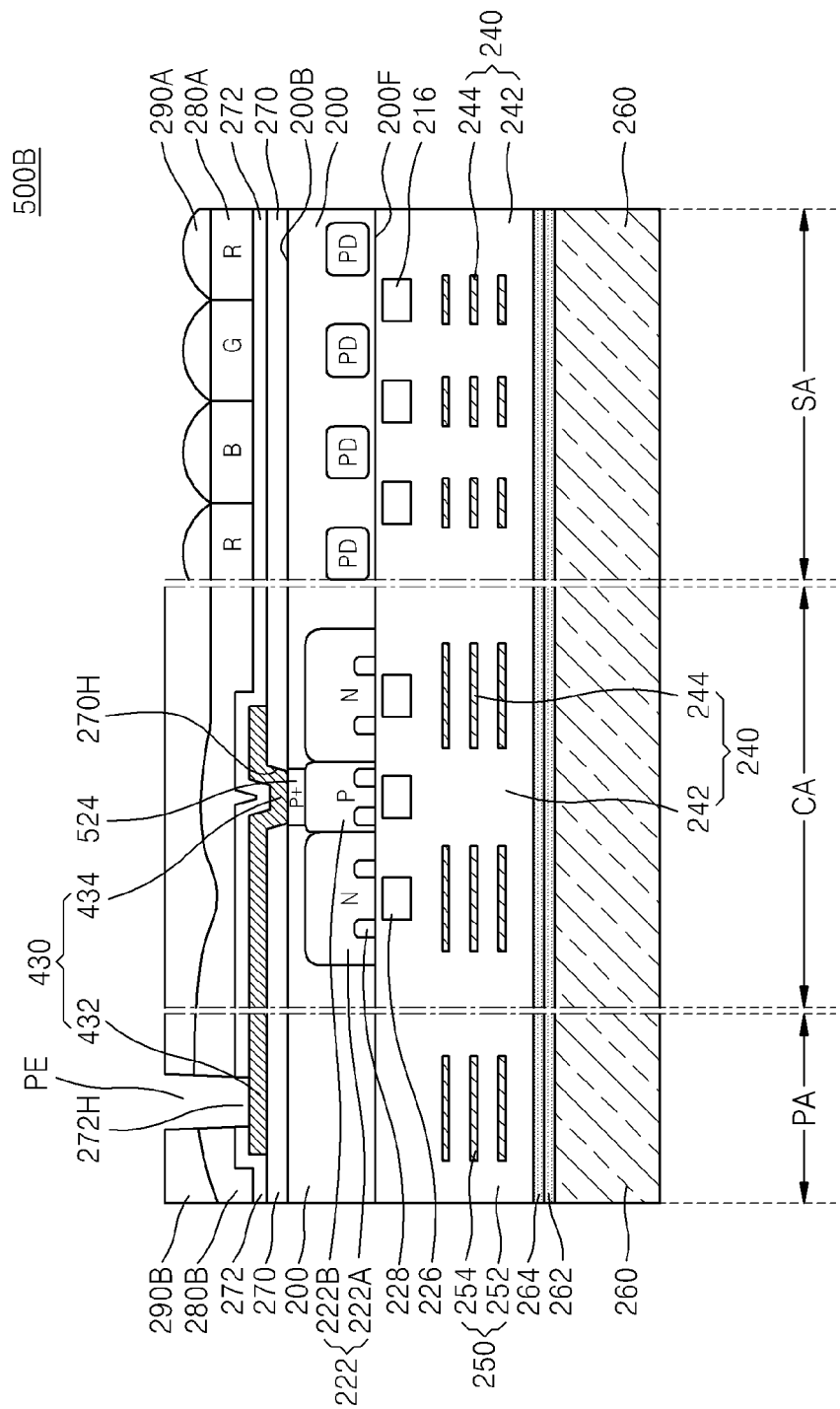
FIG. 7B is a cross-sectional view of still another version of the second embodiment of an image sensor according to the inventive concept, as also taken in a direction corresponding to that of line VI-VI' of FIG. 1.

Still another version 500B of the second embodiment of an image sensor according to the inventive concept is shown in FIG. 7B. The image sensor 500B is substantially the same as the image sensor 500 of FIG. 6 except that there is no recess 200R in the back side (surface) 200B of the substrate 200 below the metal wiring 230. Rather, the back side (surface) 200B of the substrate 200 is planar throughout the sensor array area SA, the circuit area CA, and the pad area PA. Also, the high-density impurity region 524, e.g., the P+ type well, is formed between the second well 222B and the back side (surface) 200B of the substrate 200, is exposed by the hole 270H in the insulating layer 270, and forms an ohmic contact with the connection line 434 of the metal wiring 430.

A method of manufacturing the image sensor 300 illustrated in FIG. 4 will be now be described with reference to FIGS. 8A through 8J.

Figure 2:
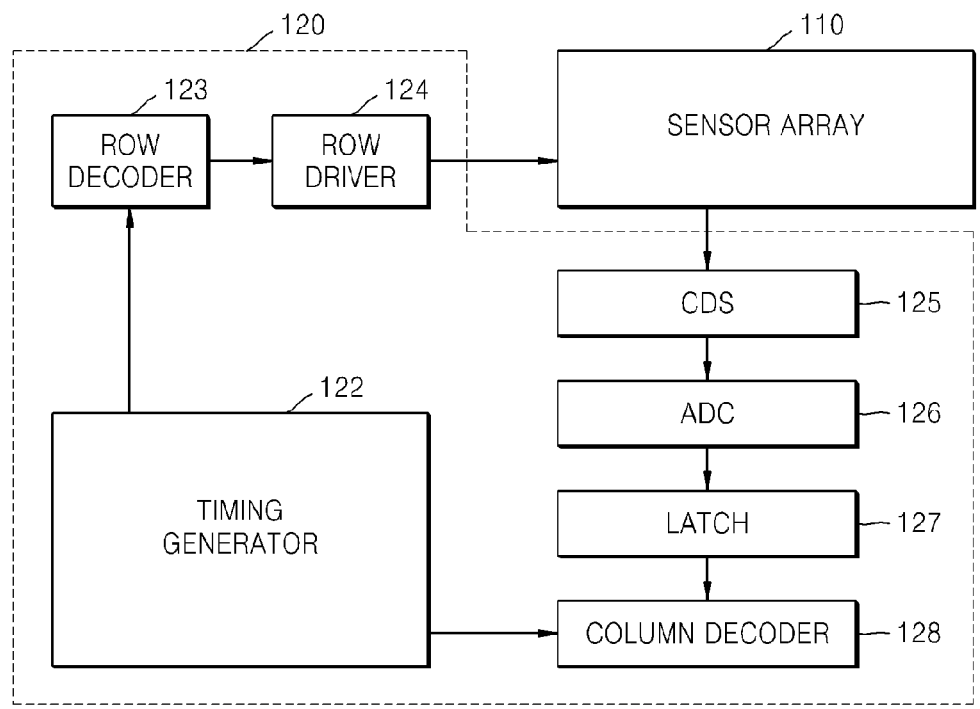
FIG. 2 is a block diagram of an example of electronic components of an image sensor according to the inventive concept.
Figure 8A:
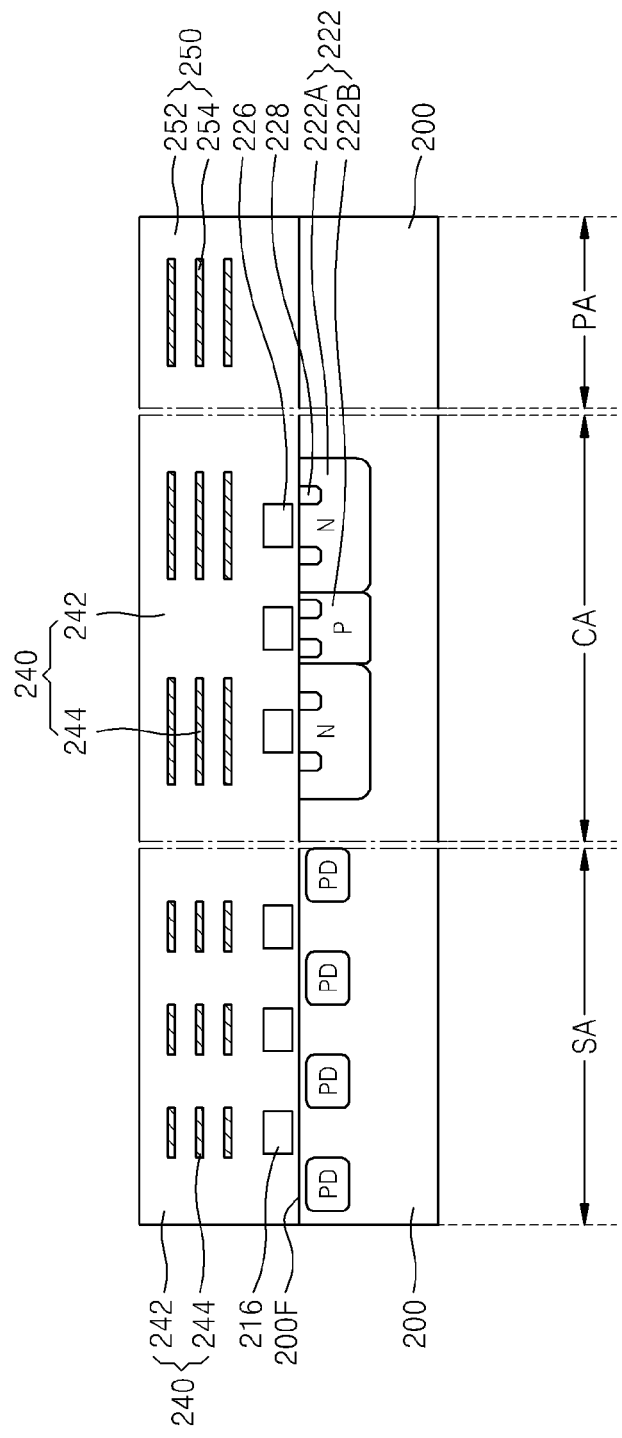

Referring to FIG. 8A, photoelectric conversion devices such as photodiodes PD and a plurality of impurity diffusion regions (not shown) are formed in the substrate 200 adjacent front side (surface) 200F of the substrate 200, and a plurality of gate electrodes 216 are formed on the front side (surface) 200F of the substrate 200, in sensor array area SA to form an array of pixels 112 (see FIG. 1).

Also, wells 222 are formed in the substrate 200 adjacent the front side (surface) of the substrate 200, a plurality of gate electrodes 226 are formed on the front side surface 200F of the substrate 200, and source/drain regions 228 are formed in each well 222 at both sides of a gate electrode 226 in the circuit area CA.

Next, the multi-layer wiring structure 240 is formed over the front side (surface) 200F of the substrate 200 in the sensor array area SA and the circuit area CA while at the same time the multi-layer wiring structure 250 is formed over the front side (surface) 200F of the substrate 200 in the pad area PA.

In this process, each of the interlayer insulating layers 242 and 252 is formed layer by layer on the substrate 200, and each individual layer constituting the interlayer insulating layer 242 is formed together in the same process as a respective layer constituting the interlayer insulating layer 252. Likewise, each wiring layer 244 and a respective dummy wiring layer 254 are formed together at the same level by the same process.

In this embodiment, the metal interlayer insulating layers 242 and 252 are formed of at least one material selected from the group consisting of a flowable oxide (FOX), a high density plasma (HDP) oxide, a tonen silazene (TOSZ), a spin on glass (SOG), and an undoped silica glass (USG).

Figure 8B:
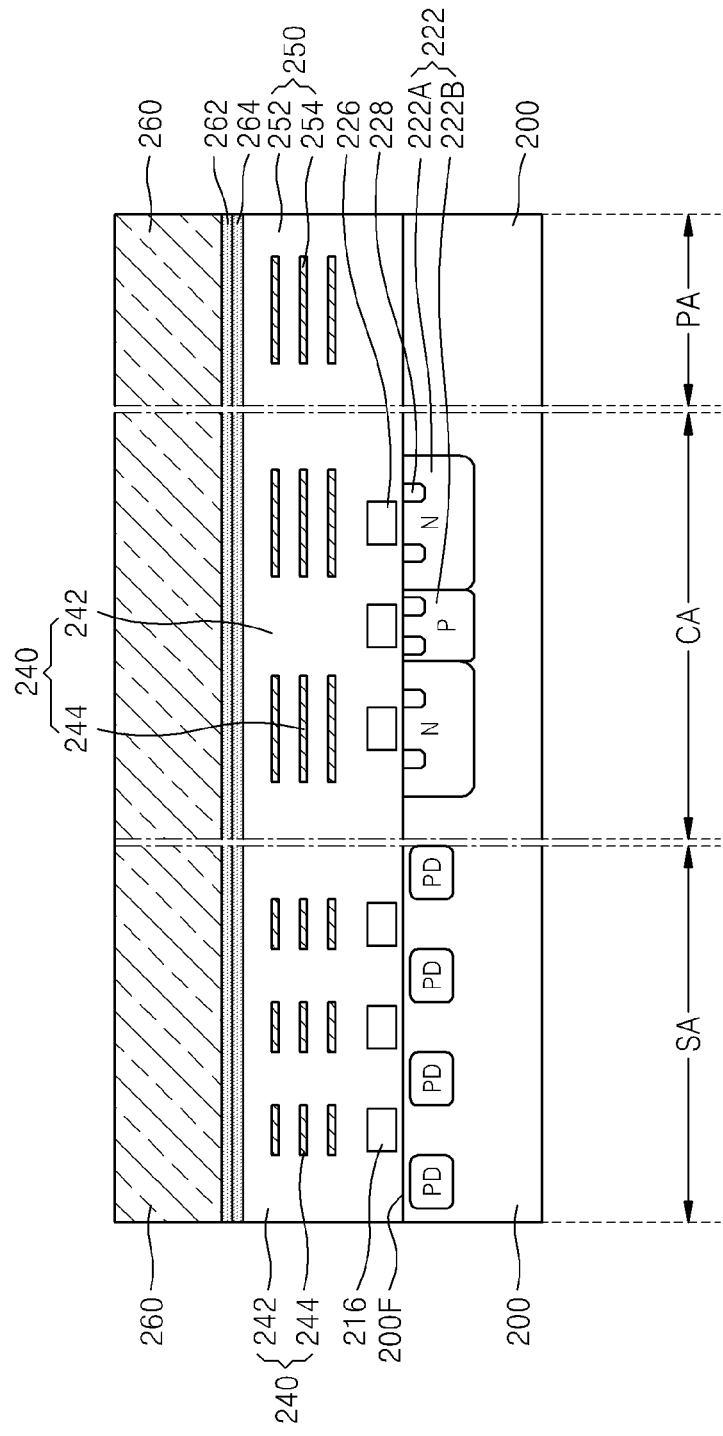

Referring to FIG. 8B, the support substrate 260 is adhered to the multi-layer wiring structures 240 and 250. More specifically, in this embodiment, a first adhesive layer 262 is adhered to the support substrate 260, and a second adhesive layer 264 is adhered to the multi-layer wiring structure 240 and 250. Then, the multi-layer wiring structures 240 and 250 and the support substrate 260 are juxtaposed so that the first adhesive layer 262 and the second adhesive layer 264 face each other, and then, the multi-layer wiring structures 240 and 250 and the support substrate 260 are pressed against each other.

Figure 8C:
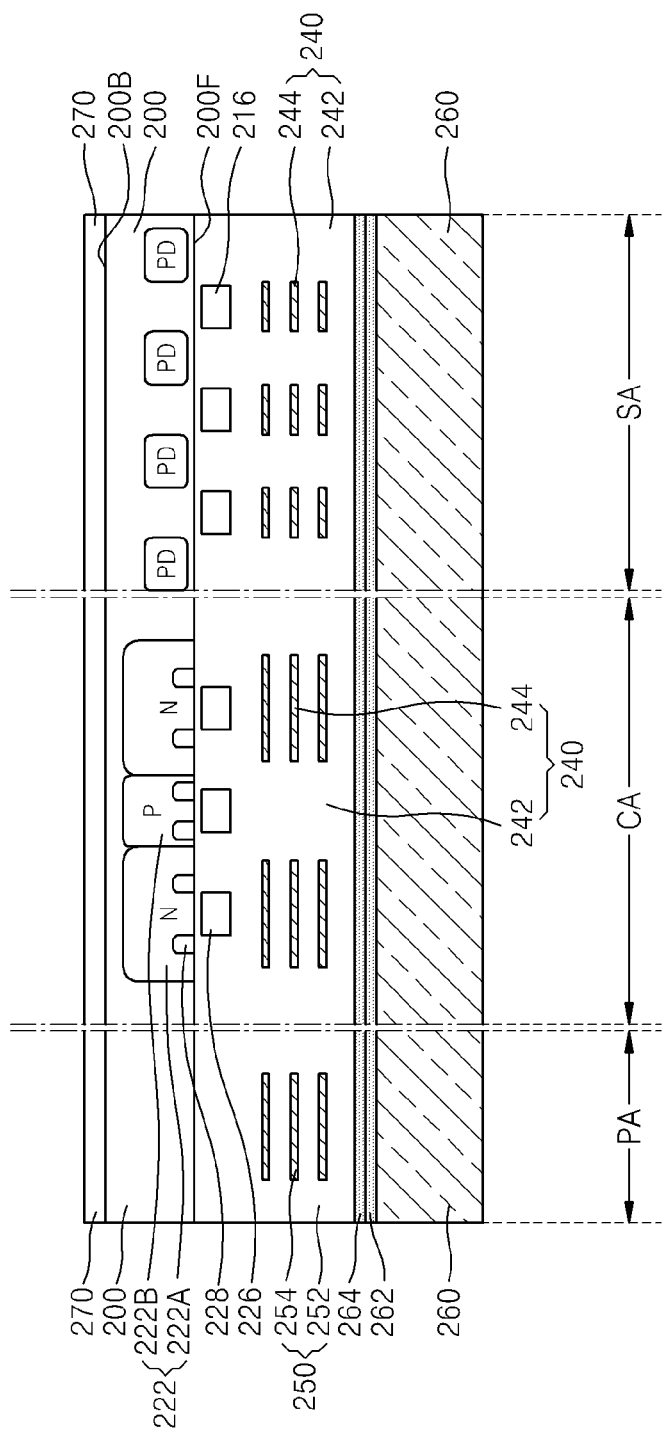

Referring to FIG. 8C, the structure is inverted, and an exposed surface of the substrate 200 is polished to reduce its thickness. At least one of a chemical mechanical polishing (CMP), a back grinding (BGR), and a reactive ion etching process may be used to polish the substrate 200. In this embodiment, after the substrate 200 has been polished, the distance from the back side (surface) 200B of the substrate 200 to the plurality of wells 222 of the circuit area CA is about 500 Å to about 2000 Å.

Then, an insulating layer 270 is formed over the polished backside surface 200B of the substrate 200. In this embodiment, the insulating layer 270 has a thickness of about 500 Å to about 2000 Å.

Figure 8D:
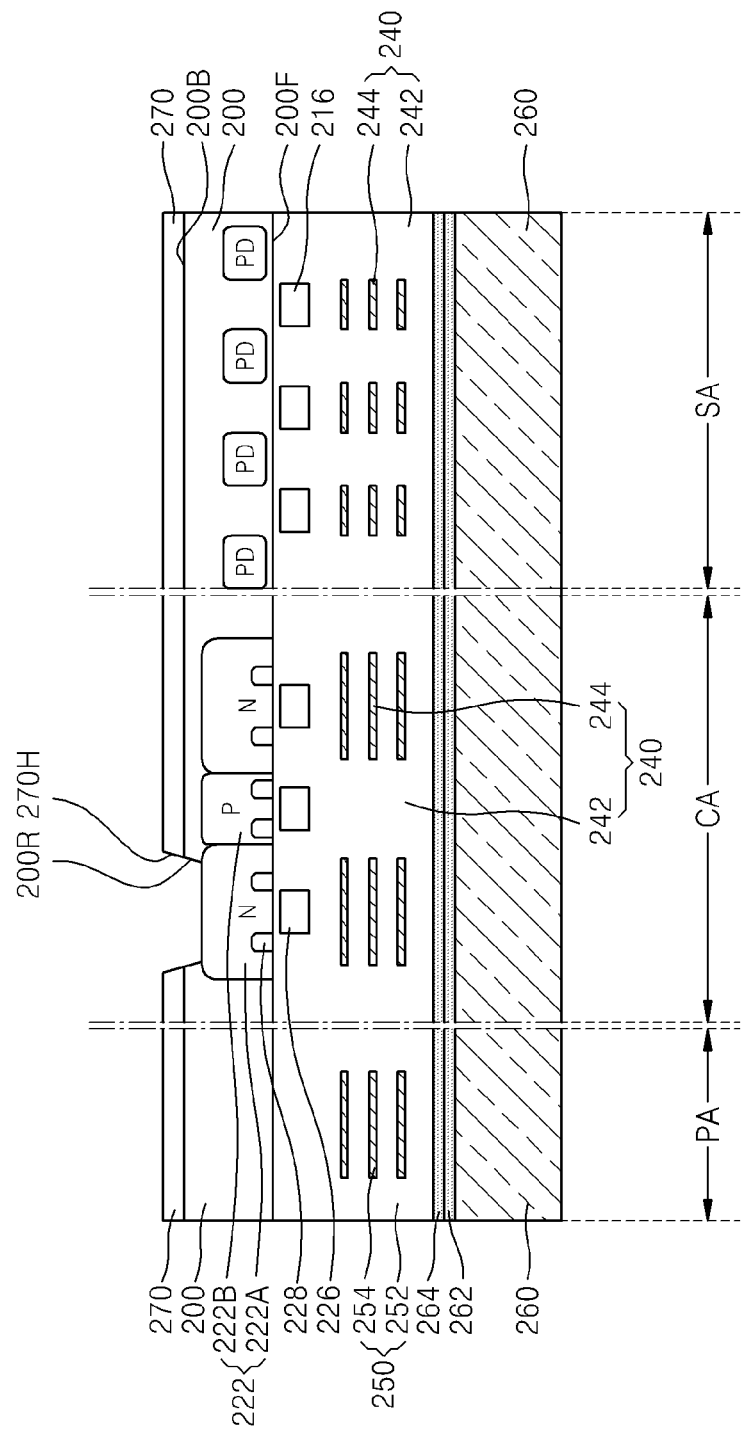

Referring to FIG. 8D, a portion of the insulating layer 270 is removed from the circuit area CA to form hole 270H in the insulating layer 270, and a portion of the substrate 200 exposed through the hole 270H is removed to form the recess 200R that is aligned with the hole 270H and exposes at least one of the wells 222. In this embodiment, the first well 222A having an N-type of conductivity is exposed through the hole 270h and the recess 200R.

Figure 8E:
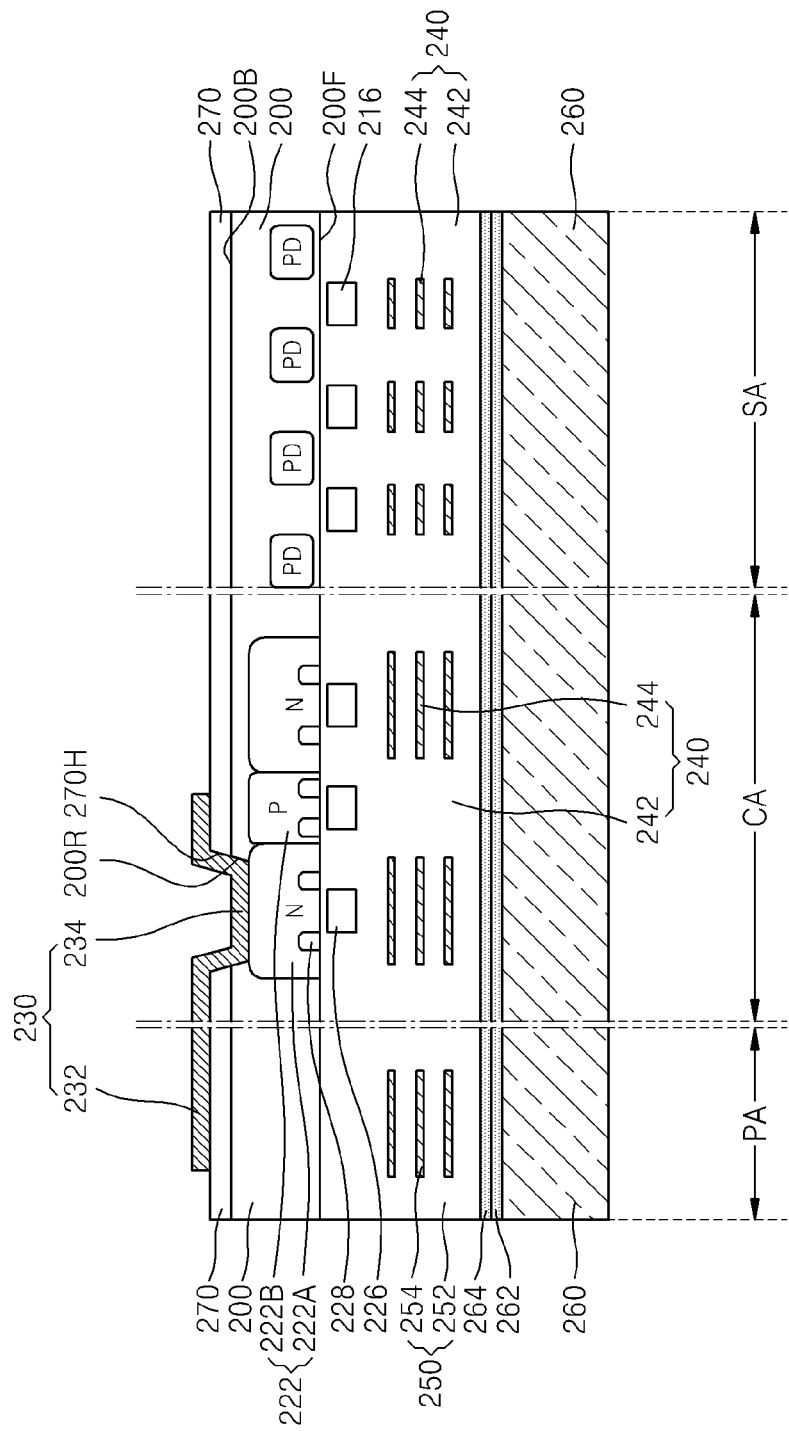

Referring to FIG. 8E, metal wiring 230 that extends from the pad area PA to the circuit area CA and contacts the at least one well 222 through the hole 270H and the recess region 200R is formed on the back side (surface) 200B of the substrate 200.

More specifically, at least one conductive layer (not shown) is formed on the exposed surface of the insulating layer 270, an exposed surface that delimits the recess 200R, and a surface of the first well 222A exposed through the recess region 200R, and then the at least one conductive layer is patterned. The at least one conductive layer may be formed of at least one layer of metal each selected from the group consisting of Al, W, and Cu. Alternatively, the at least one conductive layer may be formed of a combination of a barrier layer and a metal layer selected from the group consisting of Al, W, and Cu. The barrier layer may be formed of Ti, TiN, Ta, TaN, or a combination thereof.

The metal wiring 230 is formed to have a larger line width and/or a greater thickness than any of the wiring layers 244 and dummy wiring layers 254 of the multi-layer wiring structures 240 and 250. For example, the metal wiring 230 is formed to have a thickness of about 5000 Å to about 10000 Å. The metal wiring 230 may be formed to have a width that varies. For example, the metal wiring 230 may have a relatively small line width in one region of the sensor, and a relatively large line width in another of the image sensor.

Figure 8F:
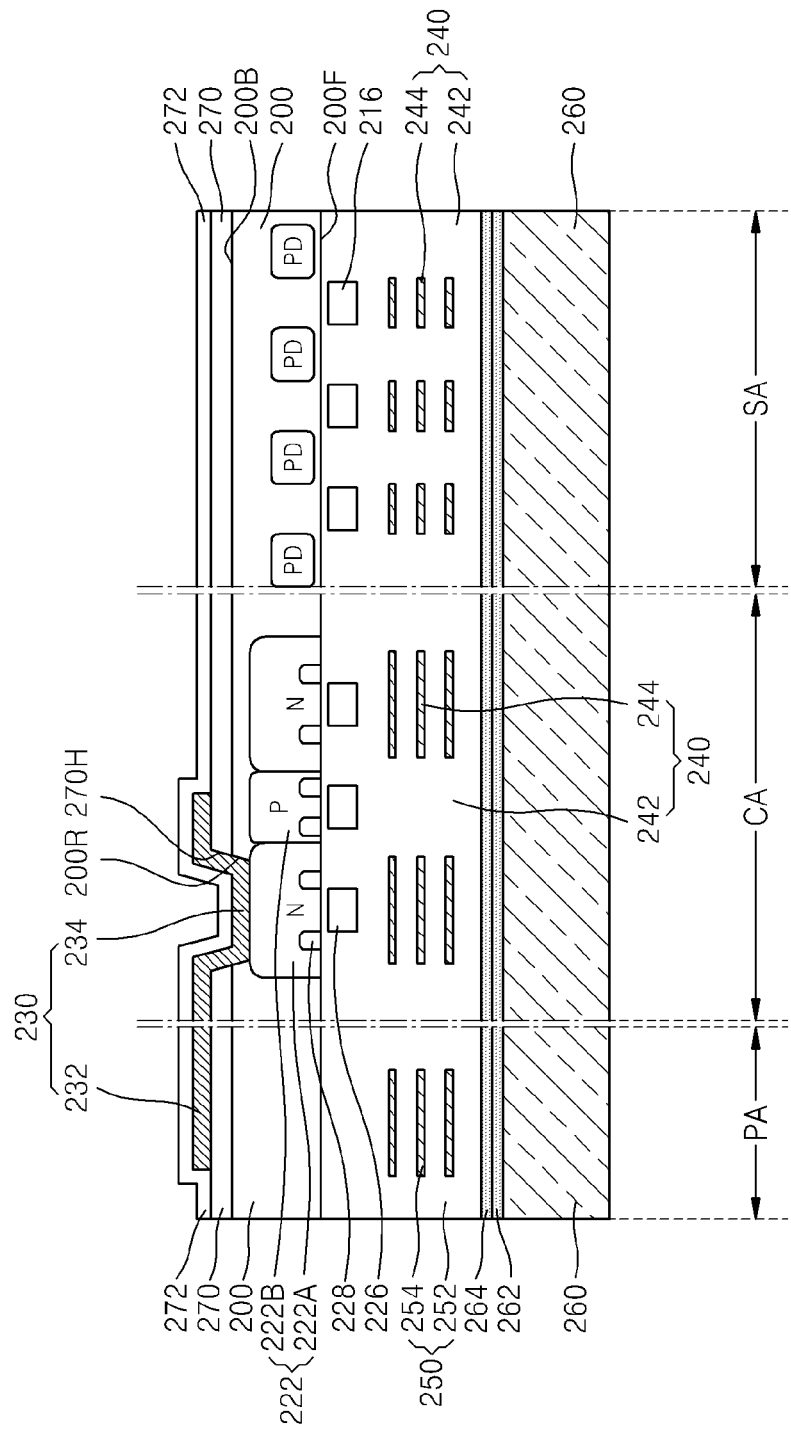

Referring to FIG. 8F, a first protection layer 272 is formed on the insulating layer 270 in the sensor array area SA, the circuit area CA, and the pad area PA, including over the metal wiring 230 in the circuit area CA and the pad area PA. In this respect, the first protection layer 272 may be formed of an oxide layer, a nitride layer, or a combination thereof to a thickness of about 2000 Å to about 3000 Å.

Figure 8G:
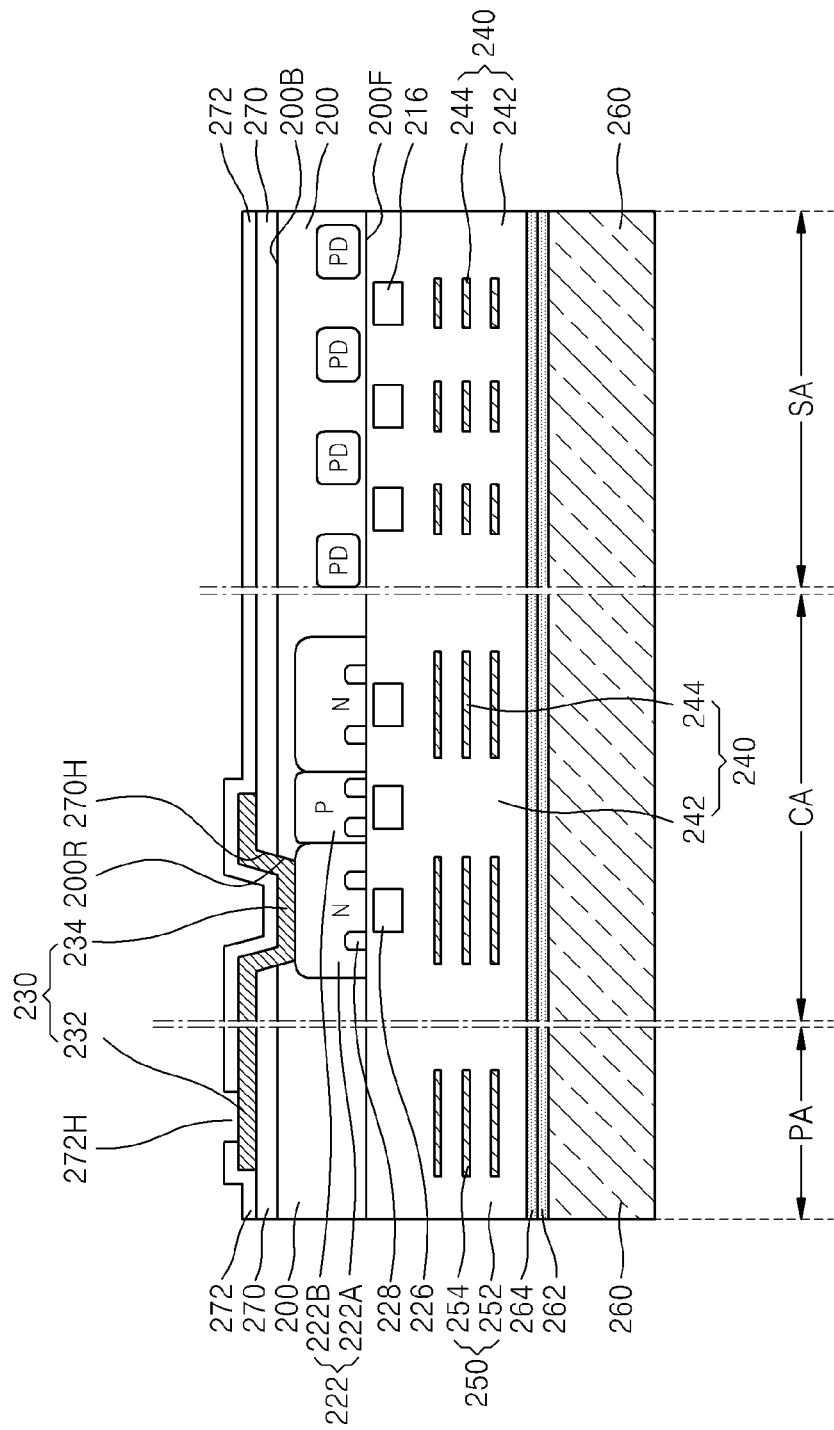

Referring to FIG. 8G, a portion of the first protection layer 272 is removed in the pad area PA to form a hole 272H in the first protection layer 272. A pad 232 of metal wiring 230 is exposed through the hole 272H.

Referring to FIG. 8H, color filters 280A are formed on the first protection layer 272 in the sensor array area SA. While the color filters 280A are being formed, a second protection layer 280B is formed on the first protection layer 272 in the circuit area CA and the pad area PA. That is, the second protection layer 280B may be formed in the same process as and hence, of the same material as, a color region of the color filters 280A. Thus, the second protection layer 280B may be formed at the same time and of the same material as an R region, a G region or a B region of the color filters 280A.

Figure 8I:
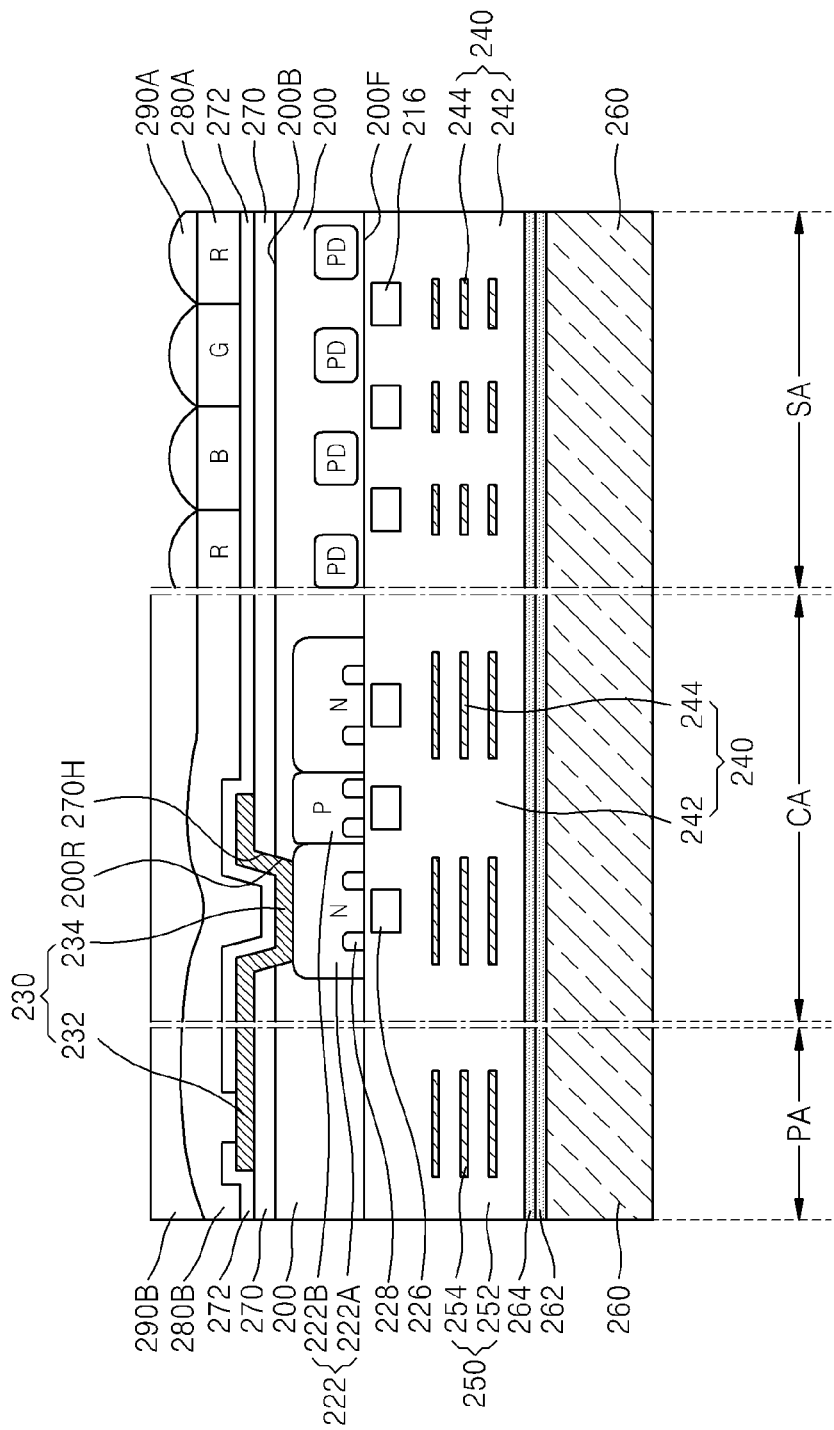

Referring to FIG. 8I, microlenses 290A are formed on the color filters 280A in the sensor array area SA, and a third protection layer 290B is formed on the second protection layer 280B in the circuit area CA and the pad area PA.

For example, a layer of material (not shown) is formed on the color filters 280A in the sensor array area SA and the second protection layer 280B in the circuit area CA and the pad area PA. The layer of material may be a TMR series resin (commercially available from Tokyo Ohka Kogyo, Co.) or an MFR series resin (commercially available from Japan Synthetic Rubber Corporation). Then the layer of material is processed only in the sensor array area SA to form the microlenses 290A while the remainder thereof is left in the circuit area CA and the pad area PA as the third protection layer 290B.

Figure 8J:
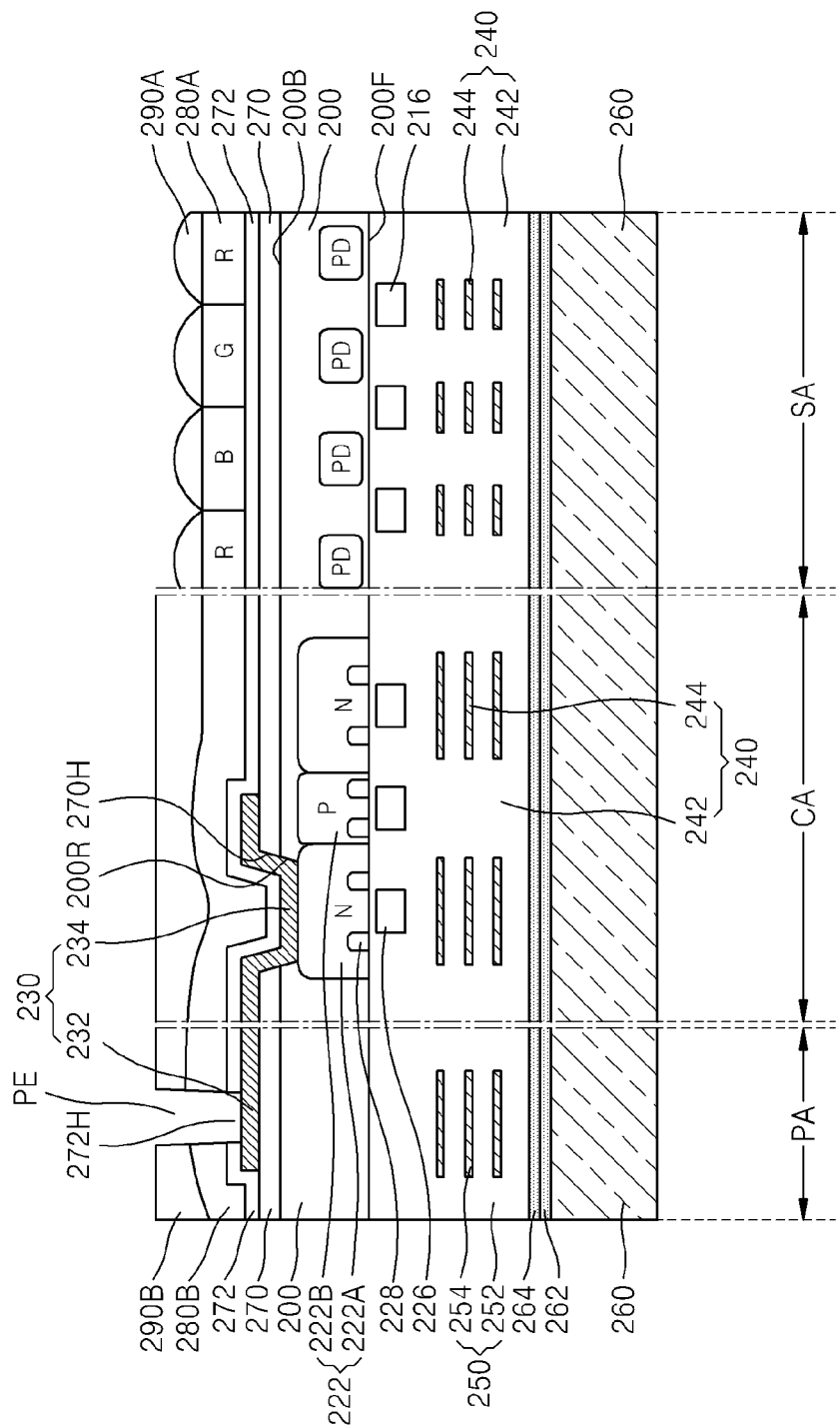

Referring to FIG. 8J, a portion of the third protection layer 290B and a portion of the second protection layer 280B are removed from the pad area PA to form a hole that is aligned with the hole 272H of the first protection layer 272 and define an exposure region PE in the third protection layer 290B and the second protection layer 280B. In the pad area PA, the metal wiring 230 is exposed to the outside at the exposure region PE.

A method of manufacturing the image sensor 300A illustrated in FIG. 5A will be described with reference to FIGS. 8A-8J and FIGS. 9A and 9B.

Referring to FIG. 9A, a structure is formed using the method shown in and described with reference to FIGS. 8A through 8D. Then impurity ions 320 are injected into the well 222 through the hole 270H in the insulating layer 270 and recess 200R in the back side (surface) of the substrate 200. The impurity ions 320 injected through the hole 270H and the recess region 200R have the same type of conductivity as that of the well 222 into which they are injected. In this case, ions having an N-type conductivity are injected into the first well 222A.

Then a spike rapid thermal annealing (RTA) operation may be performed at a relatively high temperature of about 1100° C. to activate the impurities that are ion-injected into the well 222.

As a result, a high-density impurity region 322 (e.g., N+ type well) forming a low-resistance contact is formed in the well 222 adjacent to the back side (surface) 200B of the substrate 200.

Figure 9B:
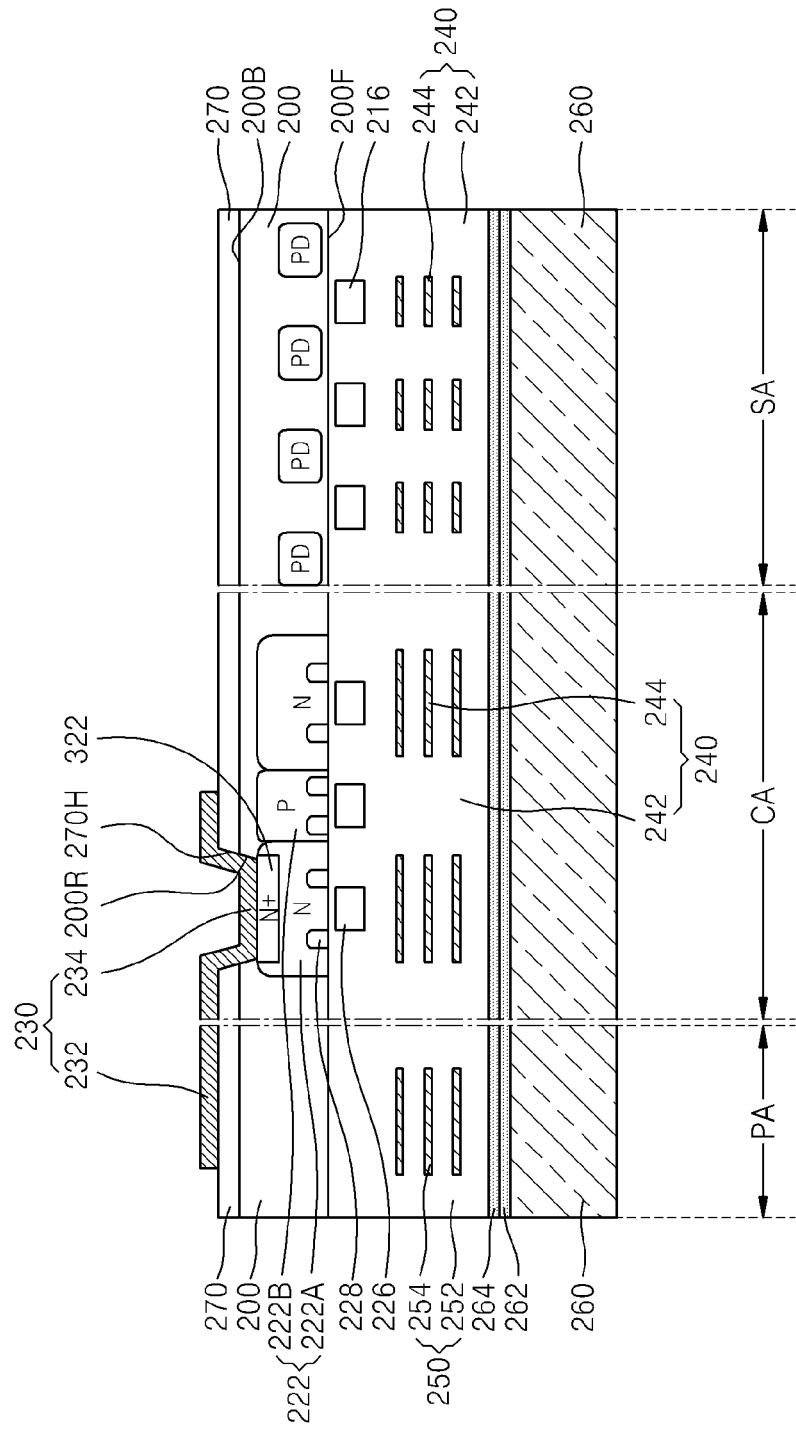

Referring to FIG. 9B, metal wiring 230 is formed on the high-density impurity region 322 in manner similar to that shown in described with reference to FIG. 8E.

The metal wiring 230 thus has a pad 232 disposed in the pad area PA and a connection line 234 that extends on the back side (surface) 200B of the substrate 200 from the pad area PA to the circuit area CA, through the hole 270H and the recess 200R and into contact with the high-density impurity region 322.

Finally, operations similar to those shown in and described with reference to FIGS. 8F through 8J are performed to form the image sensor 300A.

It will be readily apparent that the image sensors 300B, 500, 500A, and 500B illustrated in FIGS. 5B, 6, 7A, and 7B, respectively, may be formed using methods similar to those described with reference to FIGS. 8A through 8J and FIGS. 9A and 9B.

Figure 10:
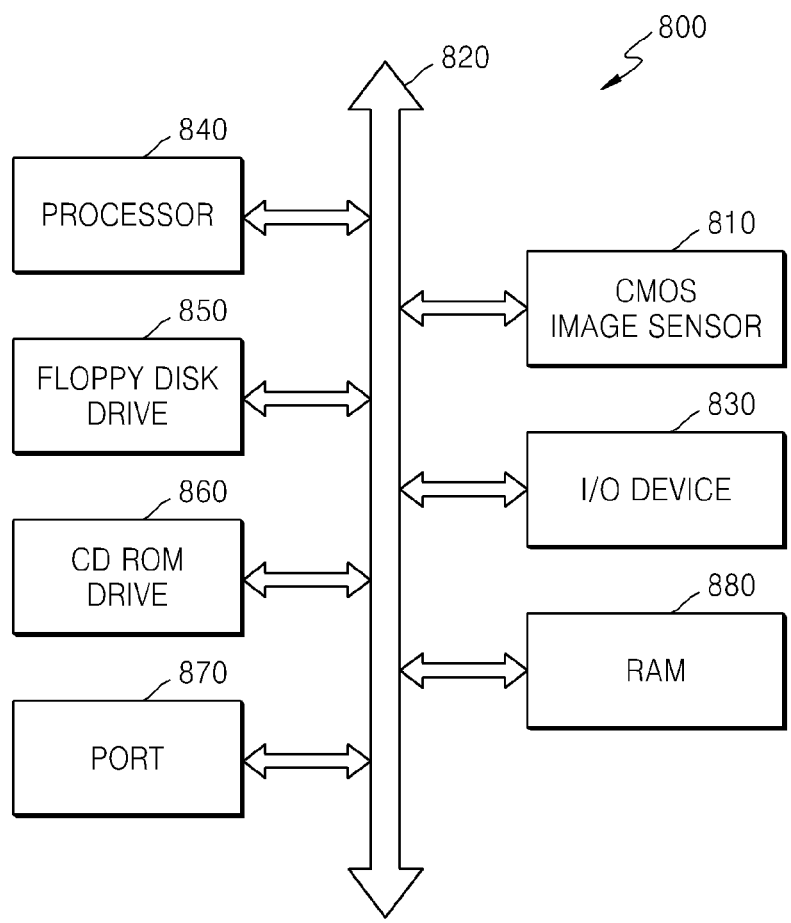
FIG. 10 is a block diagram of an imaging system including an image sensor, according to the inventive concept.

An embodiment of an imaging system 800 including an image sensor 810, according to the inventive concept, will now be described with reference to FIG. 10. The CMOS image sensor 810 may comprise any of the image sensors 100, 300, 300A, 300B, 500, 500A, and 500B described above with reference to FIGS. 1 through 7B.

The imaging system 800 includes a processor 840 capable of transmitting data to an input/output (I/O) device 830 via a bus 820. The processor 840 may be a microprocessor or a central processing unit (CPU). In the imaging system 800, the processor 840 can transmit and receive data to and from a disk drive 850, a CD ROM drive 860, a port 870, and a RAM 880 via the bus 820, in reproducing an image captured by the CMOS image sensor 810.

The port 870 may be one by which the imaging system 800 may be coupled with a video card, a sound card, a memory card, a USB device or the like. In some cases, the CMOS image sensor 810 may be integrated with the processor 840 on the same chip. In other cases, the CMOS image sensor 810 may be integrated with the processor 840 but as a separate chip from the processor 840. Also, in some cases, the CMOS image sensor 810 may be integrated with the RAM 880 on the same chip.

The imaging system 800 may be employed by any of various electronic devices such as digital cameras, camcorders, personal communication systems (PCSs), electronic games, security cameras, medical micro cameras, and image recognition systems of robots.

According to the inventive concept as described above, the metal wiring exposed to the outside of the image sensor in the pad area and which is connected to the circuits in the circuit area is formed outside the substrate. Thus, the individual wires that make up such wiring may be relatively short. In addition, there is no need to etch a relatively large thickness of a substrate or a relatively thick insulating layer to form the metal wiring. Accordingly, the metal wiring can be formed quickly and in a simple wiring forming process. In addition, the wiring may have a relatively large line width and/or a large thickness because the metal wiring 230 is formed outside the substrate 200 where the pattern density is relatively low. Accordingly, resistance from the pad area to (the wells of) the circuit area may be minimized. Also, the size of the chip may kept to a minimum by disposing the metal wiring, through which driving power is to be supplied to the circuit area, on the back side (surface) of the substrate 200.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. An image sensor having a sensor array area containing an image sensor array, a circuit area extending around the sensor array area, and a pad area outside of the circuit area, the image sensor comprising:
a substrate having an impurity region therein in the circuit area, the impurity region comprising at least one well in a body of the substrate;
a multi-layer wiring structure on a first surface of the substrate, the multi-layer wiring structure including a plurality of layers of wiring in the circuit area, and at least one dummy layer of wiring in the pad area; and
metal wiring extending from the pad area to the circuit area on a second surface of the substrate opposite to the first surface, electrically connected within the circuit area to the impurity region, and electrically isolated from each said at least one dummy layer of wiring.

2. The image sensor of claim 1, further comprising:
a protective layer disposed on the second surface of the substrate over the metal wiring in the circuit area and the pad area,
wherein the protective layer has a hole therethrough exposing the metal wiring in the pad area.

3. The image sensor of claim 1, further comprising an insulating layer covering the second surface of the substrate, wherein an upper portion of the metal wiring extends on the insulating layer in a direction parallel to the plane of the substrate.

4. The image sensor of claim 1, wherein the second surface of the substrate has a recess exposing the at least one impurity region, and the metal wiring extends through the recess into contact with the impurity region.

5. The image sensor of claim 1, further comprising a gate electrode disposed on the first surface of the substrate as juxtaposed with a well of the impurity region, and a source/drain region in the well at both sides of the gate electrode.

6. The image sensor of claim 1, wherein the metal wiring and the impurity region contact each other such that an ohmic contact is formed between the metal wiring and the impurity region.

7. The image sensor of claim 1, wherein the impurity region further comprises a high-density impurity region in the well adjacent to the second surface of the substrate, the high-density impurity region having the same type of conductivity as the well and an impurity density higher than that of the well, and
wherein the at least one metal wiring and the high-density impurity region contact each other such that an ohmic contact is formed at a junction between the metal wiring and the high-density impurity region.

8. The image sensor of claim 1, further comprising:
color filters disposed on the second surface of the substrate in the sensor array area;
microlenses on the color filters in the sensor array area; and
a protective layer covering the metal wiring in the pad area and the circuit area,
wherein the protective layer is of the same material as that of at least a portion of the color filters.

9. An image sensor having a sensor array area containing an image sensor array, a circuit area extending around the sensor array area, and a pad area outside the circuit area, the image sensor comprising: a substrate having first and second opposite surfaces, and comprising a body consisting of semiconductor material, and an impurity region in the body of semiconductor material within the circuit area, and wherein a bottom of the impurity region is situated within the body of semiconductor material as located between the first and second surfaces of the substrate, the substrate has a recess therein open at the second surface and extending within the body of semiconductor material to the bottom of the impurity region, and the impurity region constituting a well buried in the body of semiconductor material of the substrate; a plurality of gate electrodes on the first surface of the substrate in the circuit area; a multi-layer wiring structure including a plurality of layers of wiring on the plurality of gate electrodes in the circuit area; source/drain regions within each said at least one well in the circuit area; and metal wiring extending from the pad area to the circuit area on the second surface of the substrate, through the recess in the substrate, and into contact with the bottom of the impurity region.

10. The image sensor of claim 9, further comprising:
a protective layer disposed on the second surface of the substrate over the metal wiring,
wherein the protective layer has a hole therethrough exposing the metal wiring in the pad area.

11. The image sensor of claim 9, wherein the impurity region comprises a high-density impurity region in the well, the high-density impurity region having the same type of conductivity as the well and an impurity density higher than that of the well, and
wherein the metal wiring contacts the high-density impurity region.

12. The image sensor of claim 9, wherein the metal wiring comprises wires having a greater line width than wires that constitute the layers of wiring in the circuit area.

13. The image sensor of claim 9, wherein the image sensor is a backside illumination image sensor.

14. The image sensor of claim 9, wherein the semiconductor material comprises silicon.

15. The image sensor of claim 14, wherein the multi-layer wiring structure does not include any layer of active metal wiring in the pad area.

16. An image sensor having a sensor array area containing an image sensor array, a circuit area extending around the sensor array area, and a pad area outside of the circuit area, the image sensor comprising:
a substrate having first and second opposite surfaces, and comprising a body consisting of semiconductor material, a first impurity region of one conductivity type and a second impurity region of the other conductivity type and a high-density impurity region each of which is disposed in the body of semiconductor material in the circuit area;
a multi-layer wiring structure disposed on the first surface of the substrate and electrically connecting the semiconductor device to the sensor array;
metal wiring extending from the pad area to the circuit area on the second surface of the substrate; and
a protective layer disposed on the second surface of the substrate over the metal wiring in the circuit area and the pad area, and
wherein a portion of the metal wiring is exposed by the protective layer in the pad area,
the first and second impurity regions constitute p- and n-wells of a CMOS, the wells disposed side-by-side in the body of semiconductor material and having bottoms that are disposed at substantially the same level within the body of semiconductor material such that the p- and n-wells are buried in the body of semiconductor material,
one of the first and second impurity regions comprises a low-density impurity region, and the high-density impurity region has the same type of conductivity as the low-density impurity region and an impurity density higher than that of the low-density impurity region, and
the high-density impurity region is interposed between and contacts the low-density impurity region and the metal wiring, such that the metal wiring is electrically connected to one of the n- and p-wells.

17. The image sensor of claim 16, wherein the semiconductor device is a transistor having a gate electrode disposed on the first surface of the substrate over the well, and a source/drain region in the well at both sides of the gate electrode.

18. The image sensor of claim 16, wherein substrate has a recess therein and open at the second surface thereof, and the metal wiring extends through the recess and into contact with the high-density impurity region.

19. The image sensor of claim 16, wherein the low-density impurity region extends into the body of semiconductor material of the substrate from the first surface of the substrate, and the high-density impurity region is disposed within the low-density impurity region adjacent to the second surface of the substrate, and
wherein the high-density impurity region forms the bottom of said one of the n- and p-wells, and an ohmic contact is formed at a junction between the metal wiring and the high-density impurity region, the junction being located within the body of semiconductor material.

20. The image sensor of claim 16, wherein the high-density impurity region extends between the bottom of said one of the n- and p-wells and the second surface of the substrate, and
wherein an ohmic contact is formed at a junction between the metal wiring and the high-density impurity region.

* * * * *